(12) United States Patent
Song et al.

(10) Patent No.: US 12,100,706 B2
(45) Date of Patent: *Sep. 24, 2024

(54) SEMICONDUCTOR STRUCTURE AND METHOD OF FORMING THEREOF

(71) Applicant: TAIWAN SEMICONDUCTOR MANUFACTURING COMPANY LTD., Hsinchu (TW)

(72) Inventors: Jhu-Min Song, Nantou County (TW); Chien-Chih Chou, New Taipei (TW); Kong-Beng Thei, Hsinchu County (TW); Fu-Jier Fan, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 56 days.

This patent is subject to a terminal disclaimer.

(21) Appl. No.: 17/816,366

(22) Filed: Jul. 29, 2022

(65) Prior Publication Data

US 2022/0367452 A1    Nov. 17, 2022

Related U.S. Application Data

(63) Continuation of application No. 17/321,278, filed on May 14, 2021, now Pat. No. 11,410,995.

(51) Int. Cl.
| | |
|---|---|
| *H01L 27/08* | (2006.01) |
| *H01L 21/8236* | (2006.01) |
| *H01L 27/088* | (2006.01) |
| *H01L 29/40* | (2006.01) |
| *H01L 29/423* | (2006.01) |

(52) U.S. Cl.
CPC ...... *H01L 27/0883* (2013.01); *H01L 21/8236* (2013.01); *H01L 29/407* (2013.01); *H01L 29/42372* (2013.01)

(58) Field of Classification Search
None
See application file for complete search history.

(56) References Cited

U.S. PATENT DOCUMENTS

| | | | |
|---|---|---|---|
| 2009/0166708 A1* | 7/2009 | Lo | H01L 27/0207 257/E29.17 |
| 2011/0169066 A1* | 7/2011 | Moon | H10B 12/053 257/306 |
| 2013/0075803 A1* | 3/2013 | Edrei | H10B 41/10 438/258 |

* cited by examiner

*Primary Examiner* — Bilkis Jahan
(74) *Attorney, Agent, or Firm* — WPAT LAW; Anthony King

(57) ABSTRACT

A semiconductor structure and a method for forming a semiconductor structure are provided. The semiconductor structure includes a substrate, a gate electrode, a gate dielectric layer, first protection structures, a second protection structure and an insulating layer. The gate electrode is disposed within the substrate. The gate dielectric layer is disposed within the substrate and laterally surrounds the gate electrode. The first protection structures are disposed over the gate electrode. The second protection structure is disposed over the gate dielectric layer. The insulating layer is between the second protection structure and the gate dielectric layer.

20 Claims, 32 Drawing Sheets

SEMICONDUCTOR STRUCTURE AND METHOD OF FORMING THEREOF

CROSS-REFERENCE TO RELATED APPLICATION

This application is a continuation of U.S. patent application Ser. No. 17/321,278 filed on May 14, 2021, entitled of "SEMICONDUCTOR STRUCTURE AND METHOD OF FORMING THEREOF", which is incorporated by reference in its entirety.

BACKGROUND

Electronic equipment using semiconductor devices is essential for many modern applications. In the semiconductor devices, it is desirable to improve transistor performance even as devices become smaller due to ongoing reductions in device scale. Further, it is desirable to manufacture integrated circuit semiconductor devices that incorporate transistors operated at various ranges of operating voltages in a single integrated circuit. However, the manufacturing of the integrated circuit that incorporates transistors operated at different voltages involve extra steps and operations, thereby increasing manufacturing cost and time. As such, there are many challenges in efficiently integrating transistors of different operating voltages in a single semiconductor substrate.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
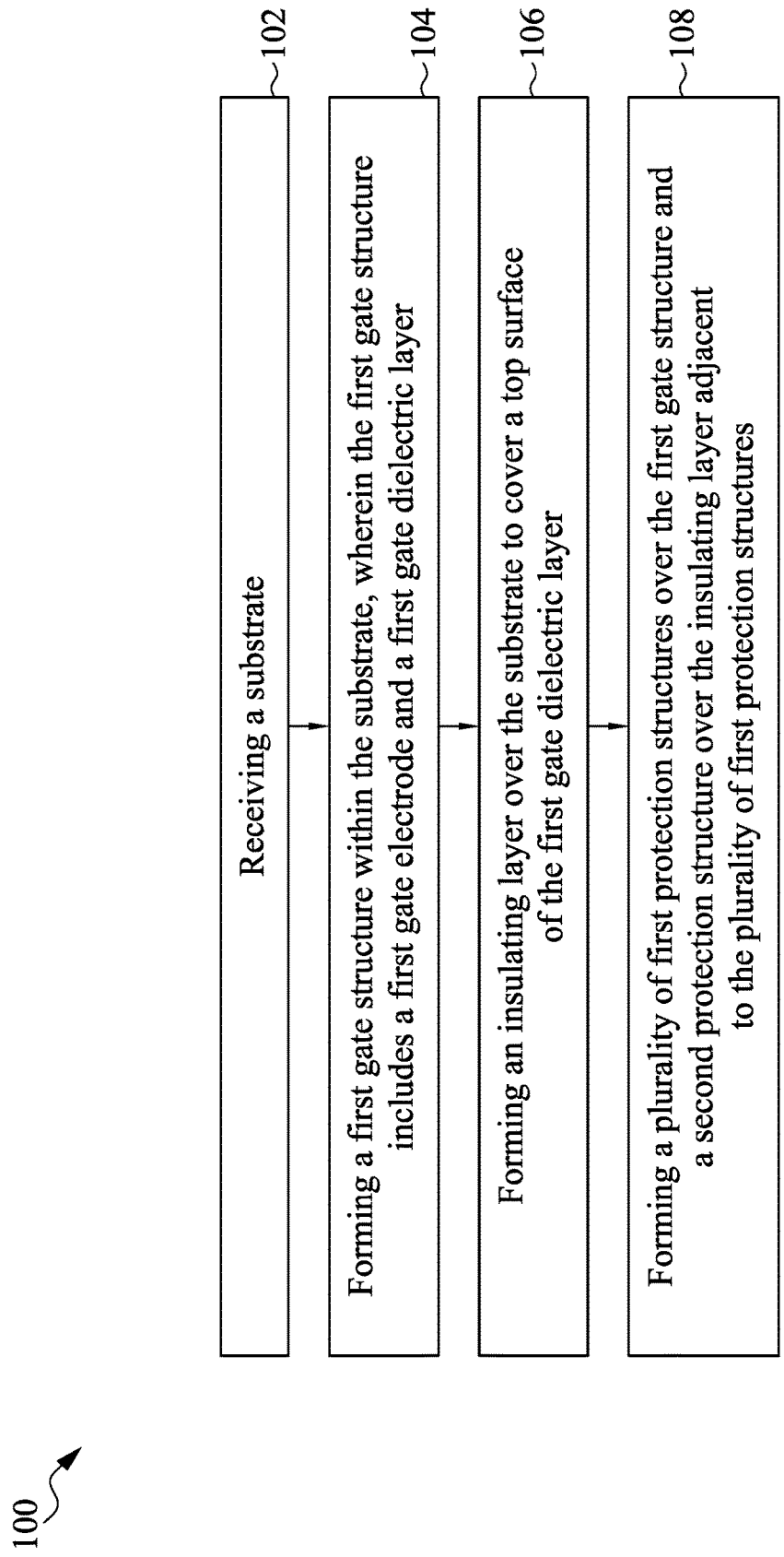
FIG. 1 is a flowchart representing a method for forming a semiconductor structure according to aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

Along the development of semiconductor industry, it has been a trend to fabricate as many semiconductor devices as possible on a single chip. For example, different semiconductor devices operated at ranges of low voltages, medium voltages, and high voltages are manufactured in a single chip. Generally, these semiconductor devices with different operating voltages are manufactured using different processes. For example, semiconductor devices manufactured by the replacement gate technology, also known as high-k metal gate (HKMG) technology, may be applied in the low-voltage devices. However, there are concerns in integrating the processes of manufacturing high-voltage devices or medium-voltage devices with those of manufacturing low-voltage devices, especially for the 28-nm technology node and beyond. To increase the yield of device integration, various factors should be considered, such as the devices with varies dimensions, e.g., different gate dielectric thicknesses, channel lengths, and/or channel widths of devices with different operating voltages. Also, since planarization processes are needed when fabricating the devices (used for planarizing metals or interlayer dielectrics for example), the dishing effect (especially to the high-voltage devices or medium-voltage devices with large device areas) may degrade the device performance.

Embodiments of a semiconductor structure and a forming method thereof are therefore provided. The semiconductor structure may have a first-voltage device disposed in a first device region and a second-voltage device disposed in a second device region. In some embodiments, the method for forming the semiconductor structure includes forming the low-voltage devices over the high/medium-voltage devices to share the HKMG processes of forming replacement gates in order to reduce manufacturing cost. The method further includes forming an insulating layer prior to the forming of the low-voltage devices to avoid a potential breakdown between the gate and source/drain region of the high/medium-voltage devices.

FIG. 1 is a flowchart representing a method 100 for forming a semiconductor structure 200 according to aspects of one or more embodiments of the present disclosure. The method 100 for forming the semiconductor structure 200 includes an operation 102 where a substrate is received. The method 100 further includes an operation 104 where a first gate structure is formed in the substrate. In some embodiments, the first gate structure includes a first gate electrode and a first gate dielectric layer. The method 100 further includes an operation 106 where an insulating layer is formed over the substrate to cover a top surface of the first gate dielectric layer. The method 100 further includes an operation 108 where a plurality of first protection structures are formed over the first gate structure and a second protection structure is formed over the insulating layer.

FIGS. 2 through 30 are schematic drawings illustrating the semiconductor structure 200 at different fabrication stages constructed according to aspects of one or more embodiments of the present disclosure.

Figure 2:
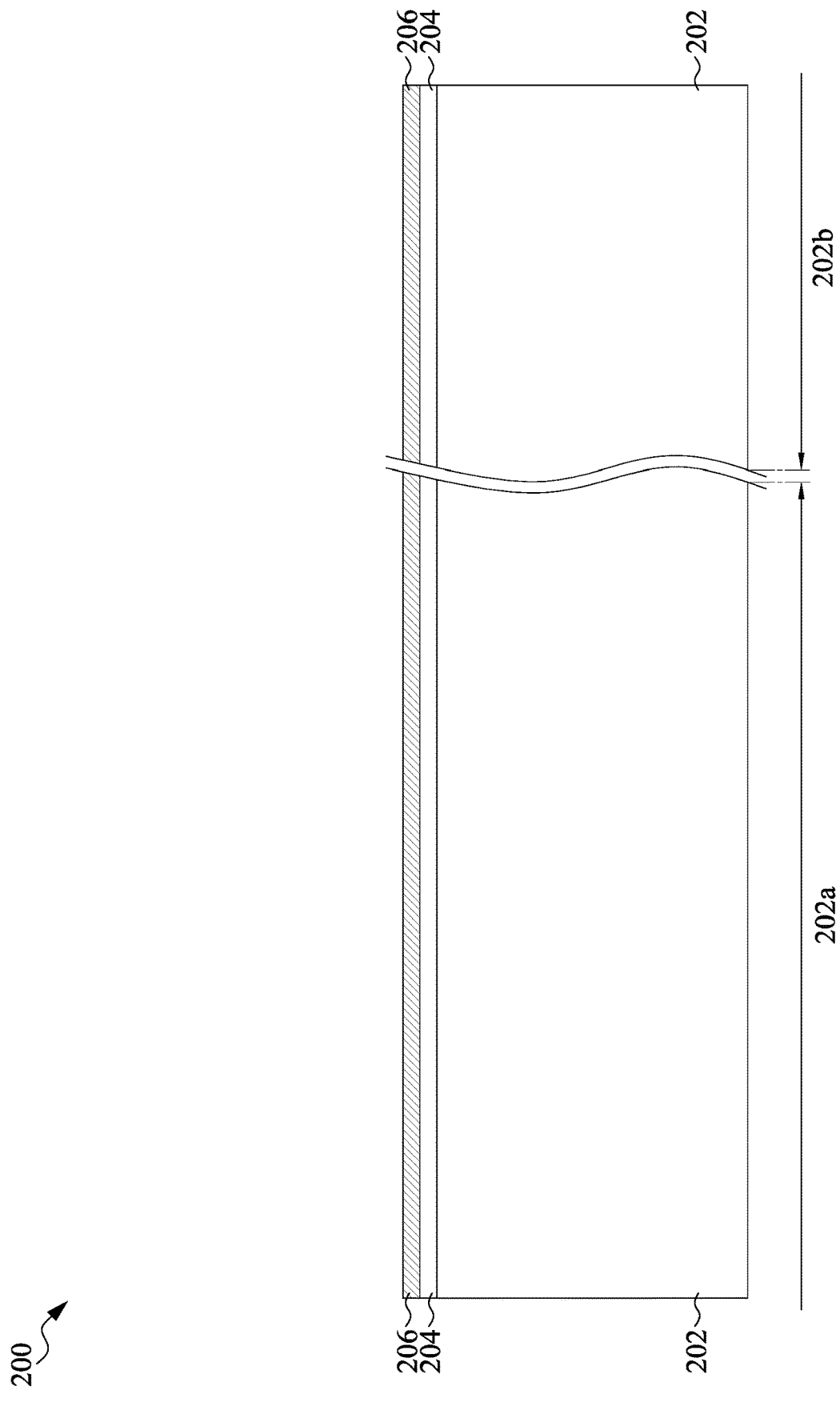
FIGS. 2 through 30 are cross-sectional views illustrating a semiconductor structure at different fabrication stages constructed according to aspects of one or more embodiments of the present disclosure.

Referring to FIG. 2, a substrate 202 is received or formed according to operation 102. The substrate 202 may be a semiconductor wafer such as a silicon wafer. Alternatively or additionally, the substrate 202 may include elementary semiconductor materials, compound semiconductor materials, or alloy semiconductor materials. Examples of elementary semiconductor materials may be, for example but not limited thereto, single crystal silicon, polysilicon, amorphous silicon, germanium (Ge), and/or diamond. Examples of compound semiconductor materials may be, for example but not limited thereto, silicon carbide (SiC), gallium arsenic (GaAs), gallium phosphide (GaP), indium phosphide (InP), indium arsenide (InAs), and/or indium antimonide (InSb). Examples of alloy semiconductor material may be, for example but not limited thereto, SiGe, GaAsP, AlInAs, AlGaAs, GaInAs, GaInP, and/or GaInAsP. The substrate 202 may also be a bulk semiconductor substrate or a Semiconductor-On-Insulator (SOI) substrate. In accordance with some exemplary embodiments, the substrate 202 is doped with p-type impurities. In alternative embodiments, the substrate 202 is doped with n-type impurities.

The substrate 202 may include various device regions. In some embodiments, the substrate 202 includes a first device region 202a and a second device region 202b. The first device region 202a and the second device region 202b may include different devices with different operating voltage ranges. For example, the first device region 202a is a first-voltage device region in which a first-voltage device 210a (see FIG. 27) is formed. The second device region 202b is a second-voltage device region in which a second-voltage device 210b (see FIG. 27) is formed. The second-voltage device 210b is configured to operate at operating voltages (or supply voltages) lower than the respective operating voltages (or supply voltages) of the first-voltage device 210a. In accordance with some exemplary embodiments, the first device region 202a is a high-voltage (HV) MOS device region or a medium-voltage (MV) MOS device region, while the second device region 202b is a low-voltage (LV) MOS device region.

It is appreciated that the HV, MV, and LV MOS devices are related each other in their operating voltages. The HV MOS devices are configured to operate at a voltage range (or supply voltages) higher than that of the MV MOS devices, and the MV MOS devices are configured to operate at a voltage range (or supply voltages) higher than that of the LV MOS devices. Also, the maximum allowable voltages in the MV MOS devices are lower than the maximum allowable voltages in HV MOS devices, and the maximum allowable voltages in the LV MOS devices are lower than the maximum allowable voltages in the MV MOS devices. In accordance with some exemplary embodiments, the operating voltages (or the supply voltages) of the HV MOS devices are between about 25 V and about 30 V, the operating voltages (or the supply voltages) of the MV MOS devices are between about 3.0 V and about 20 V, and the operating voltages (or the supply voltages) of the LV MOS devices are between about 0.5 V and about 3.0 V.

FIGS. 2 through 5 illustrate the formation of shallow trench isolation (STI) regions. Referring to FIG. 2, a pad layer 204 and a mask layer 206 are formed over the substrate 202. The pad layer 204 may include a thin film formed of silicon oxide, which may be formed, for example, using a thermal oxidation process. The pad layer 204 may serve as an adhesion layer between the substrate 202 and the mask layer 206. The pad layer 204 may also serve as an etch stop layer during etching the mask layer 206. In accordance with some embodiments of the present disclosure, the mask layer 206 is formed of silicon nitride, which may be formed, for example, using Low-Pressure Chemical Vapor Deposition (LPCVD), thermal nitridation of silicon, Plasma-Enhanced Chemical Vapor Deposition (PECVD), or plasma anodic nitridation. The mask layer 206 may be used as a hard mask during subsequent photolithography process.

Figure 3:
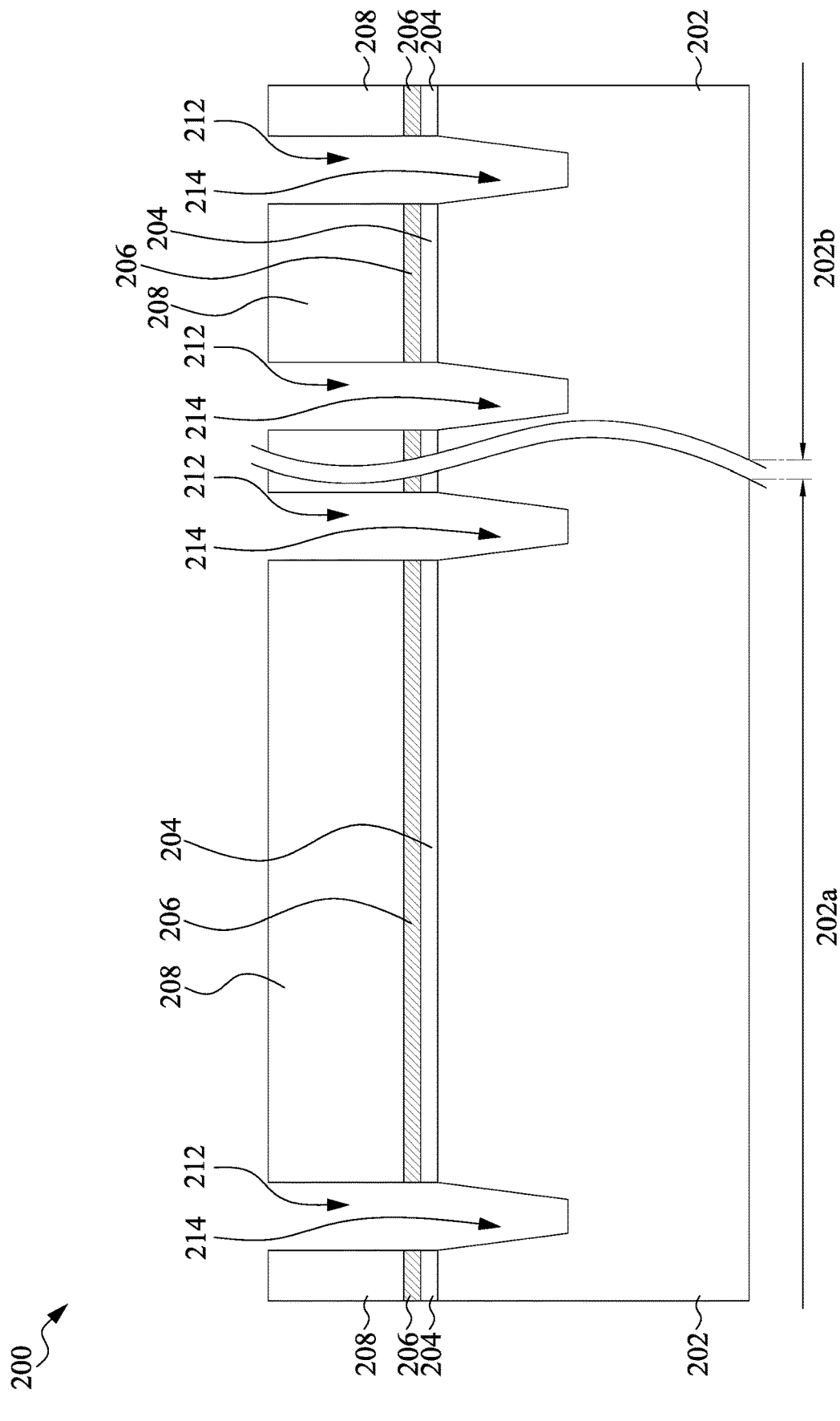

Referring to FIG. 3, a photo resist layer 208 is formed on the mask layer 206 and is then patterned to form openings 212. The mask layer 206 and the pad layer 204 are etched through the openings 212, exposing the underlying substrate 202. The exposed substrate 202 is then etched, forming trenches 214. The photo resist layer 208 is then removed.

Figure 4:
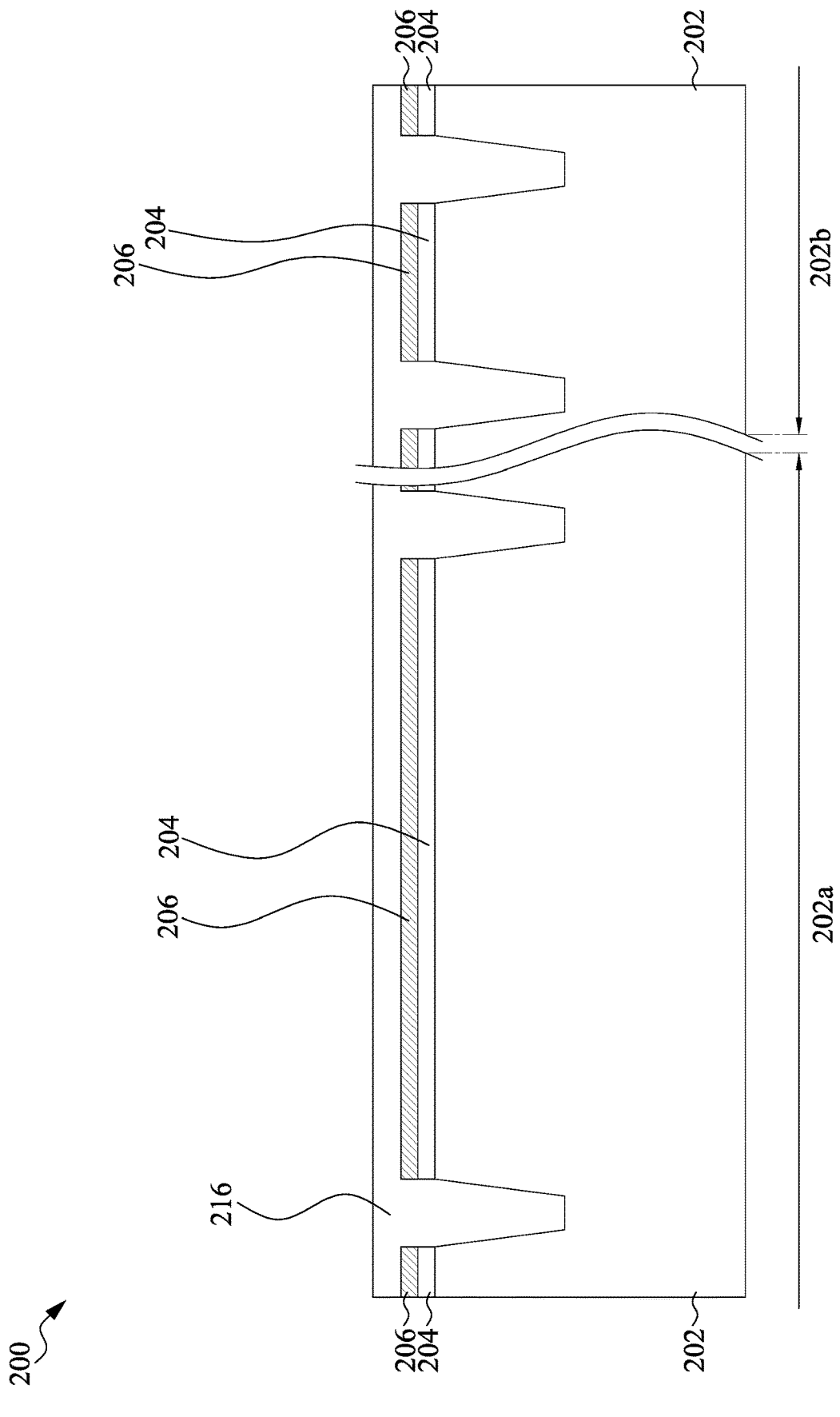

Referring to FIG. 4, dielectric material(s) 216 is filled into the trenches 214. In some embodiments, the dielectric material 216 includes a liner oxide lining the bottoms and the sidewalls of the opening 212. The liner oxide may be a thermal oxide layer forming by oxidizing a surface layer of the exposed substrate 202. In other embodiments, the liner oxide is formed using a deposition technique that can form conformal oxide layers. In some embodiments, after the formation of the liner oxide, the remaining portions of the trenches 214 are filled with another dielectric material. In some embodiments, the filling material includes silicon oxide, and other dielectric materials such as SiN, SiC, SiON, or the like, may also be used.

Figure 5:
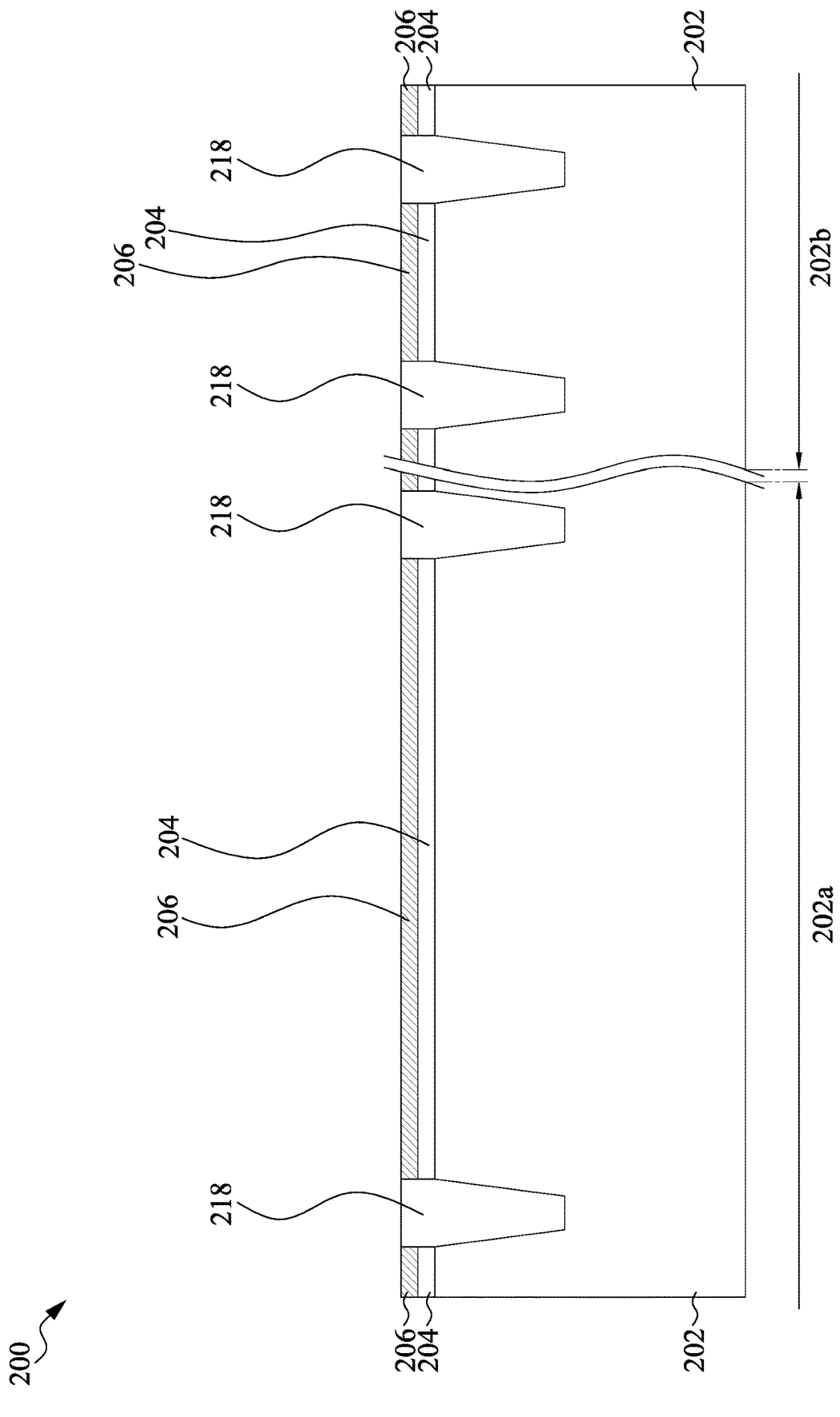

Referring to FIG. 5, a planarization such as Chemical Mechanical Polish (CMP) is then performed to remove excess portions of the dielectric material 216 over the top surface of the mask layer 206, resulting in the structure shown in FIG. 5. The mask layer 206 may serve as a CMP stop layer. The remaining portion of the dielectric material 216 forms isolation structures 218. In some embodiments, the bottom surfaces of isolation structures 218 are substantially level with each other.

Figure 6:
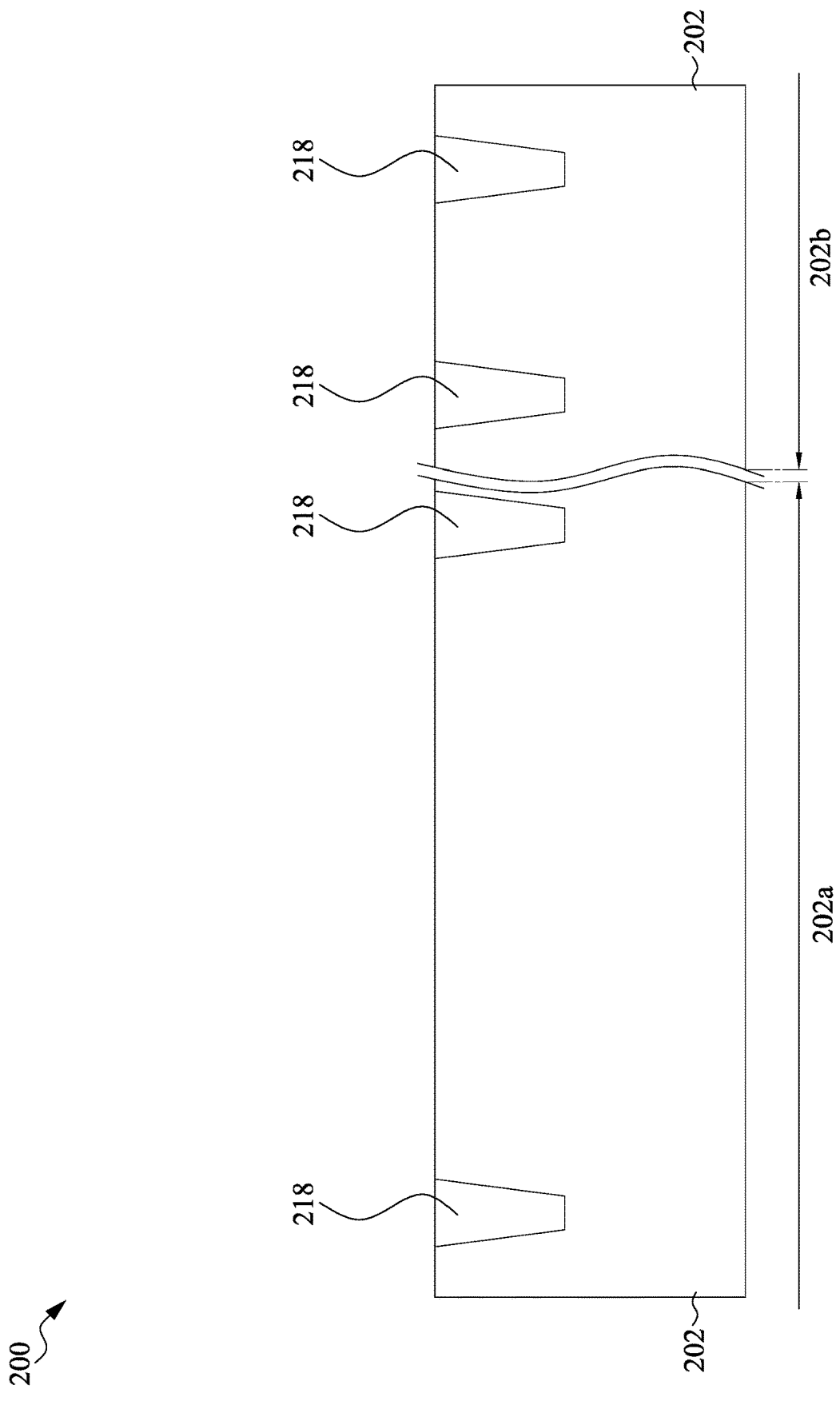

Referring to FIG. 6, in subsequent steps, the mask layer 206 and the pad layer 204 are removed. In some embodiments, the mask layer 206 and the pad layer 204 are removed by cleaning processes. The mask layer 206, when formed of silicon nitride, may be removed by a wet clean process, while the pad layer 204, when formed of silicon oxide, may be removed in a wet etching process.

Figure 7:
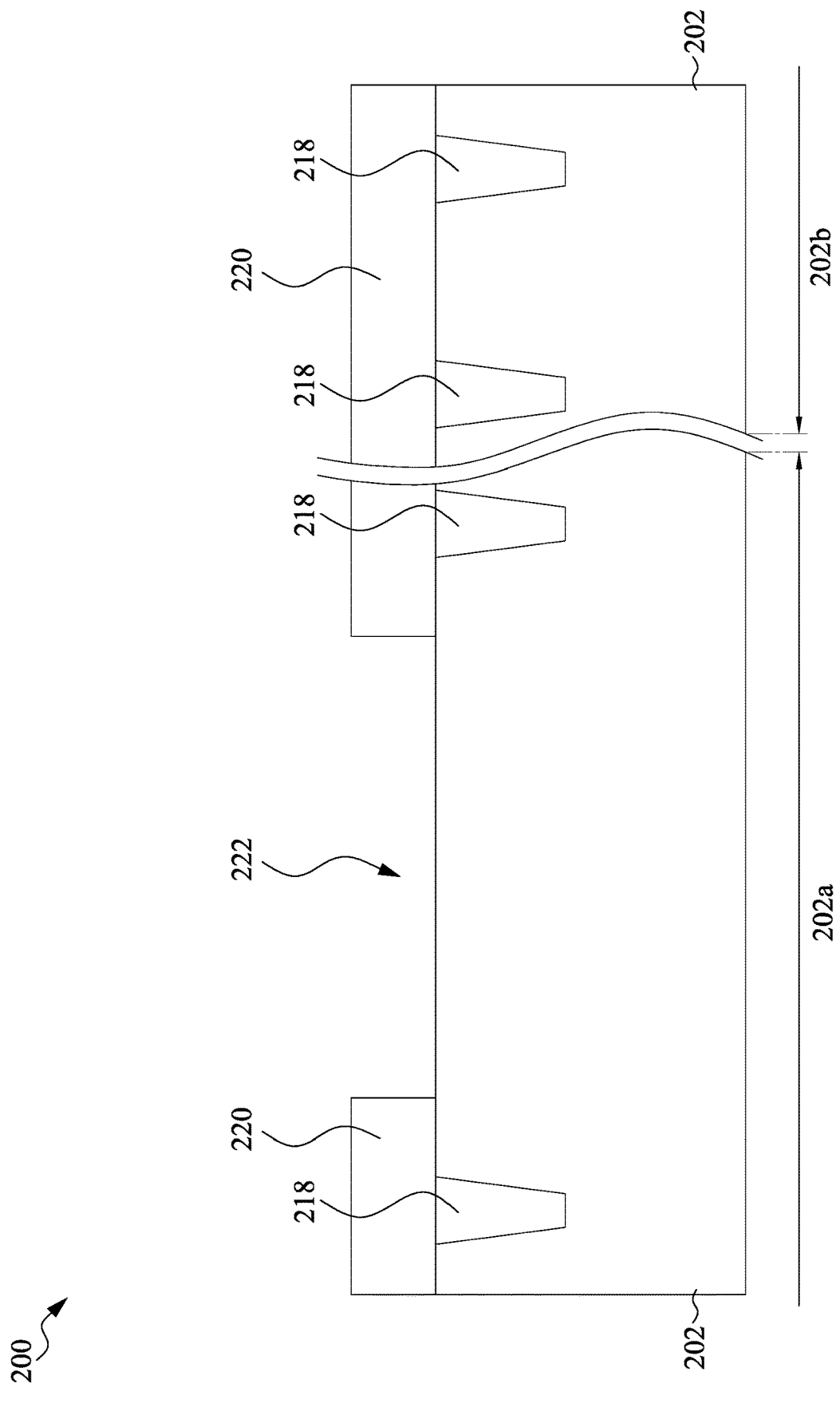

Referring to FIG. 7, a photo resist layer 220 is formed over the substrate 202 and patterned to form an opening 222. A portion of the substrate 202 is exposed through the opening 222. In some embodiments, at least a portion in the first device region 202a of the substrate 202 is exposed through the opening 222, while the second device region 202b of the substrate 202 is covered by the photo resist layer 220. The photo resist layer 220 may further cover the isolation structures 218 in the first device region 202a and the second device region 202b.

Figure 8:
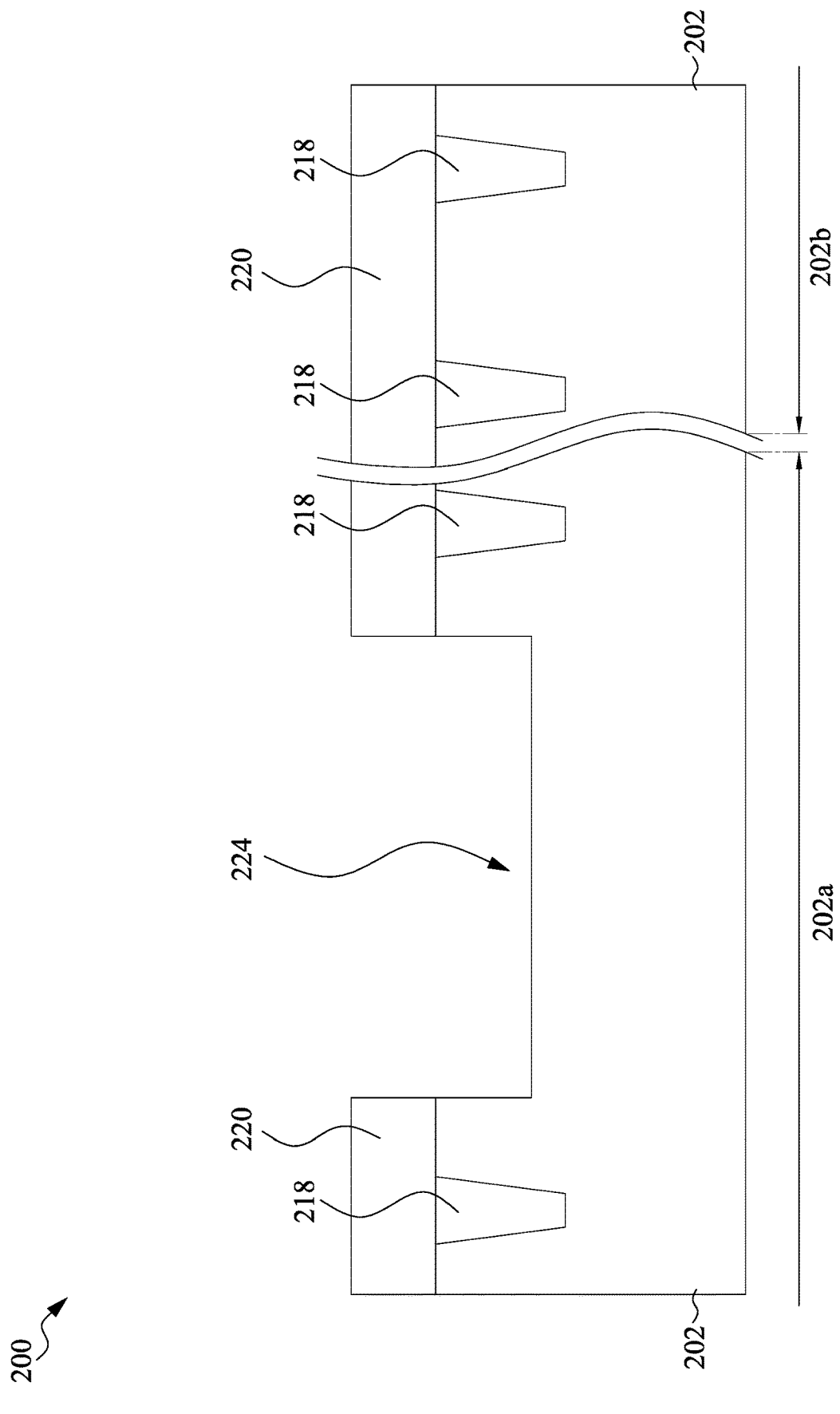
Figure 9:
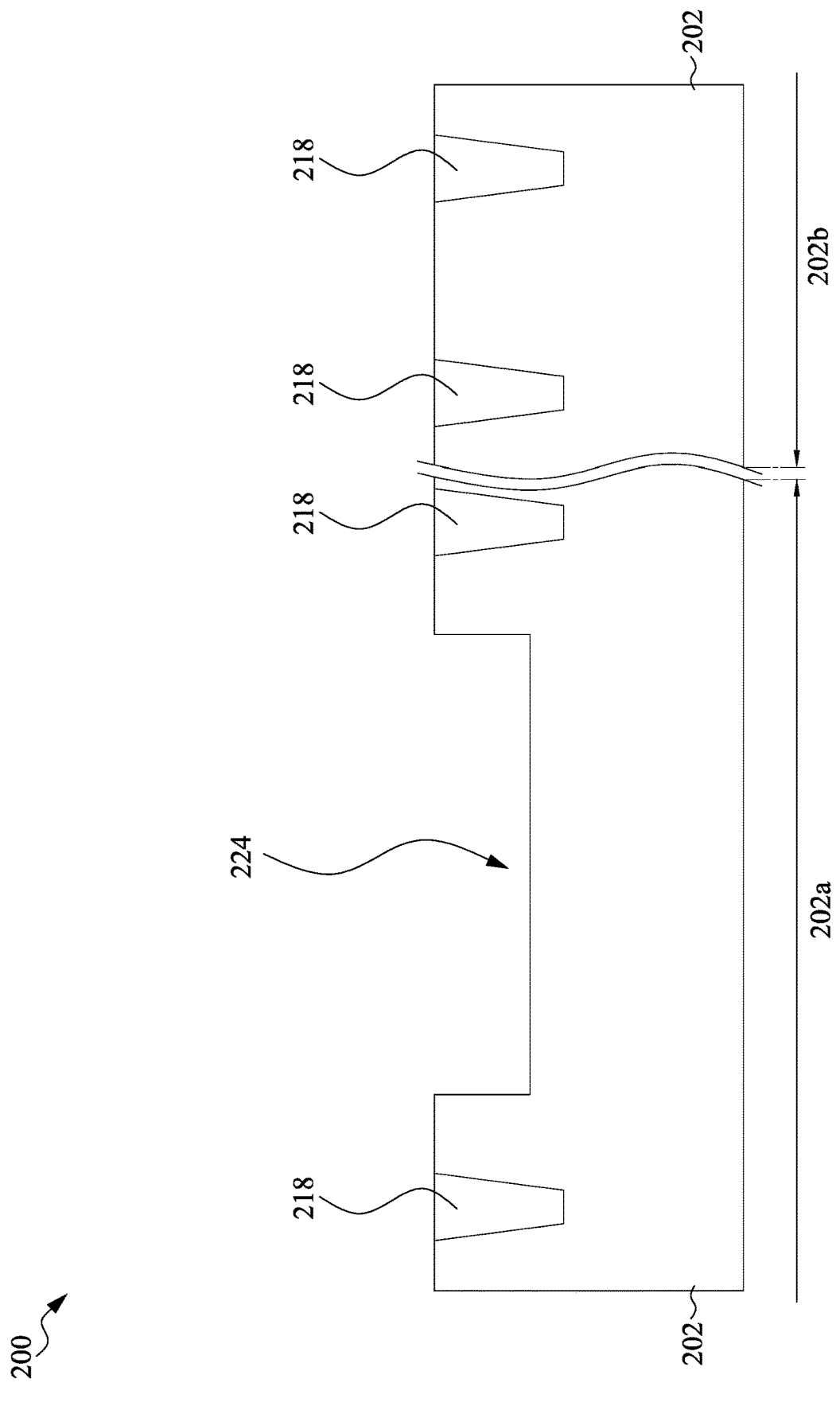

Referring to FIG. 8, the portion of the exposed substrate 202 is etched, forming a recess 224 in the first device region 202a. The etching may be performed through a dry etching process using an etching gas. The etching may also be performed through a wet etching process using an etching solution. As a result of the etching, an upper portion of the substrate 202 in the first device region 202a is removed. In some embodiments, a depth of the recess 224 may be less than a depth of the isolation structures 218. In alternative embodiments, the depth of the recess 224 may be substantially same as the depths of the isolation structures 218. The optimal depth of the recess 224 is determined by various factors, such as the thickness of the gate dielectric 242 and the thickness of the gate electrode 244 to be formed (see FIG. 14). For example, the depth of the recess 224 is such selected that the thickness of the gate dielectric 242 can meet the voltage-sustaining requirement for HV MOS devices or MV MOS devices. The etching process may be adjusted to determine the maximum allowable voltage and the saturation current of the resulting HV MOS device or MV MOS device. After the etching, the photo resist layer 220 is removed, as shown in FIG. 9.

Figure 10:
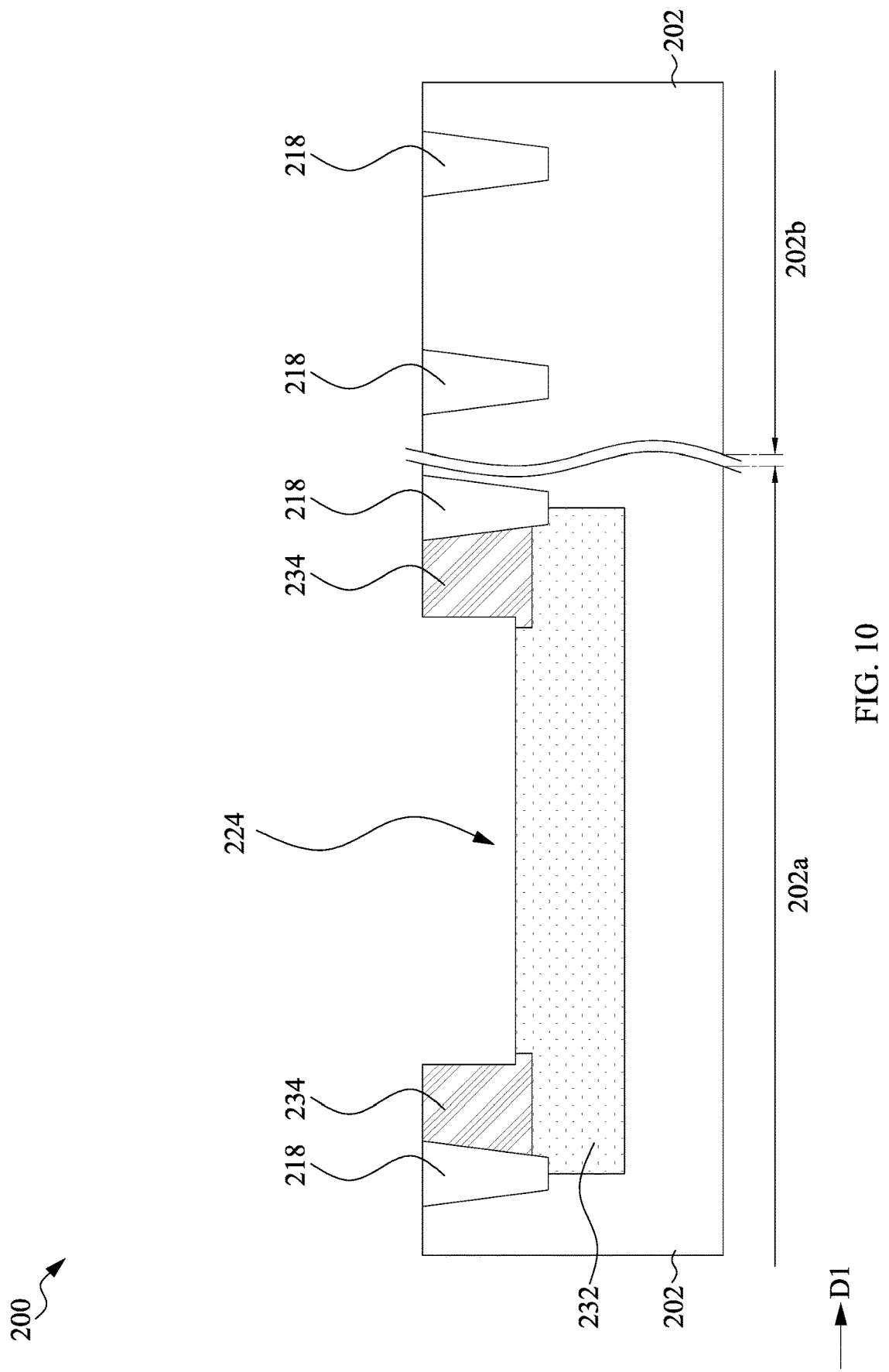
Figure 11:
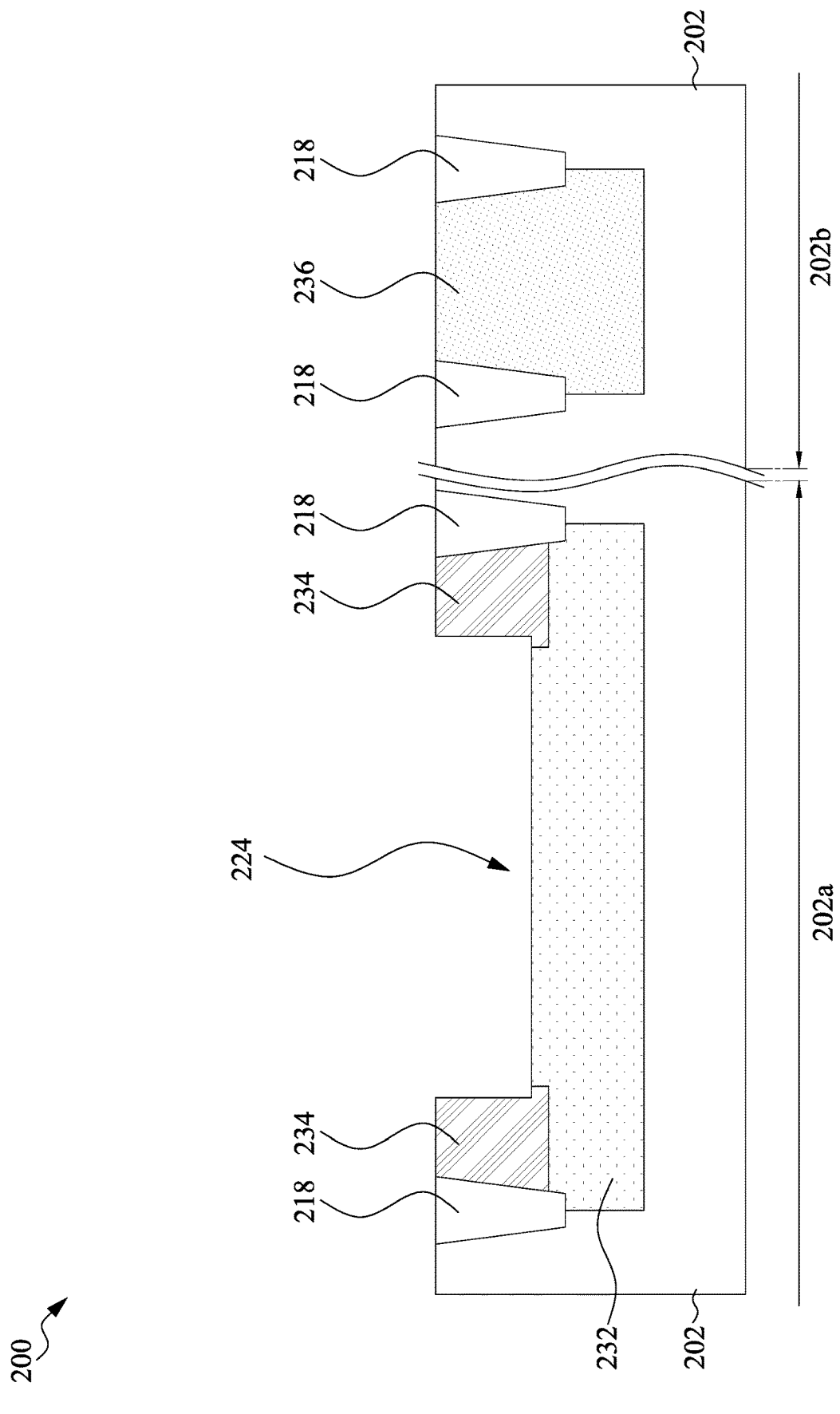

FIGS. 10 and 11 illustrate the formation of a plurality of doped regions through a plurality of implantation processes. The plurality of doped regions may include a deep well region 232 and at least two shallow doped regions 234 in the first device region 202a and a deep well region 236 in the second device region 202b. In some embodiments, the deep well regions 232 and 236 are p-type regions, and the shallow doped regions 234 are n-type regions. In alternative embodiments, the deep well regions 232 and 236 are n-type regions, and the shallow doped regions 234 are p-type regions. The implantation processes for forming the deep well regions 232, 236, and the shallow doped regions 234 may be arranged in any order.

Referring to FIG. 10, a photo resist layer (not shown) is formed to cover the substrate 202, with the region in which the deep well region 232 and the shallow doped regions 234 are to be formed exposed to the opening of the photo resist layer. In some embodiments, a p-type impurity such as boron and/or indium is implanted into substrate 202 to form the deep well region 232. In some embodiments, an n-type impurity such as phosphorous, arsenic, and/or antimony is implanted to form the shallow doped regions 234. The photo resist layer is then removed.

Referring to FIG. 11, another photo resist layer (not shown) is formed to cover the substrate 202, with the region in which the deep well region 236 is to be formed exposed to the opening of the photo resist layer. A p-type impurity implantation may be then performed in order to form deep well region 236. The deep well region 236 may be implanted with boron or indium. In some embodiments, the deep well region 236 has a p-type impurity concentration higher than the impurity concentration of the deep well region 232. The photo resist layer is then removed.

Figure 12:
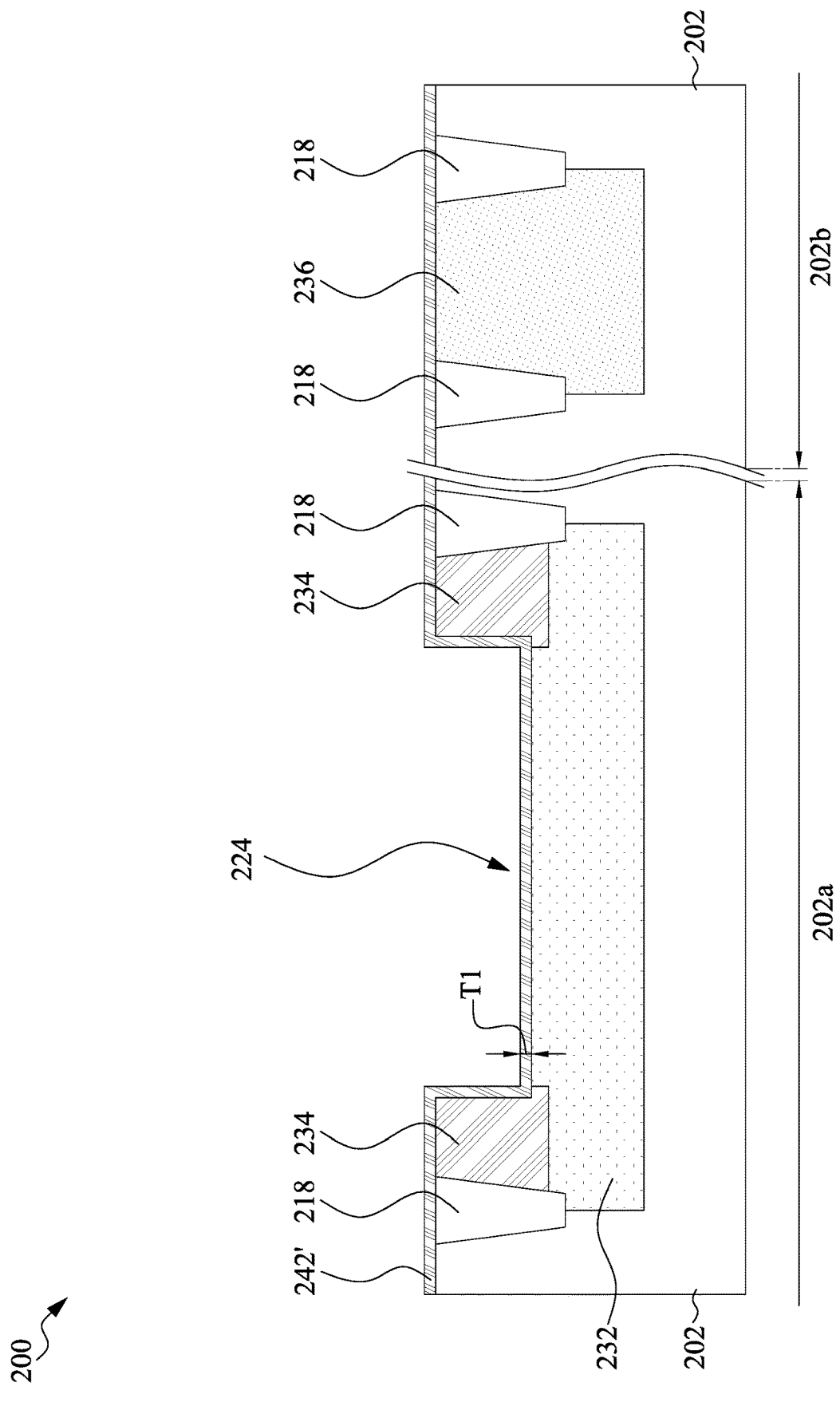
Figure 13:
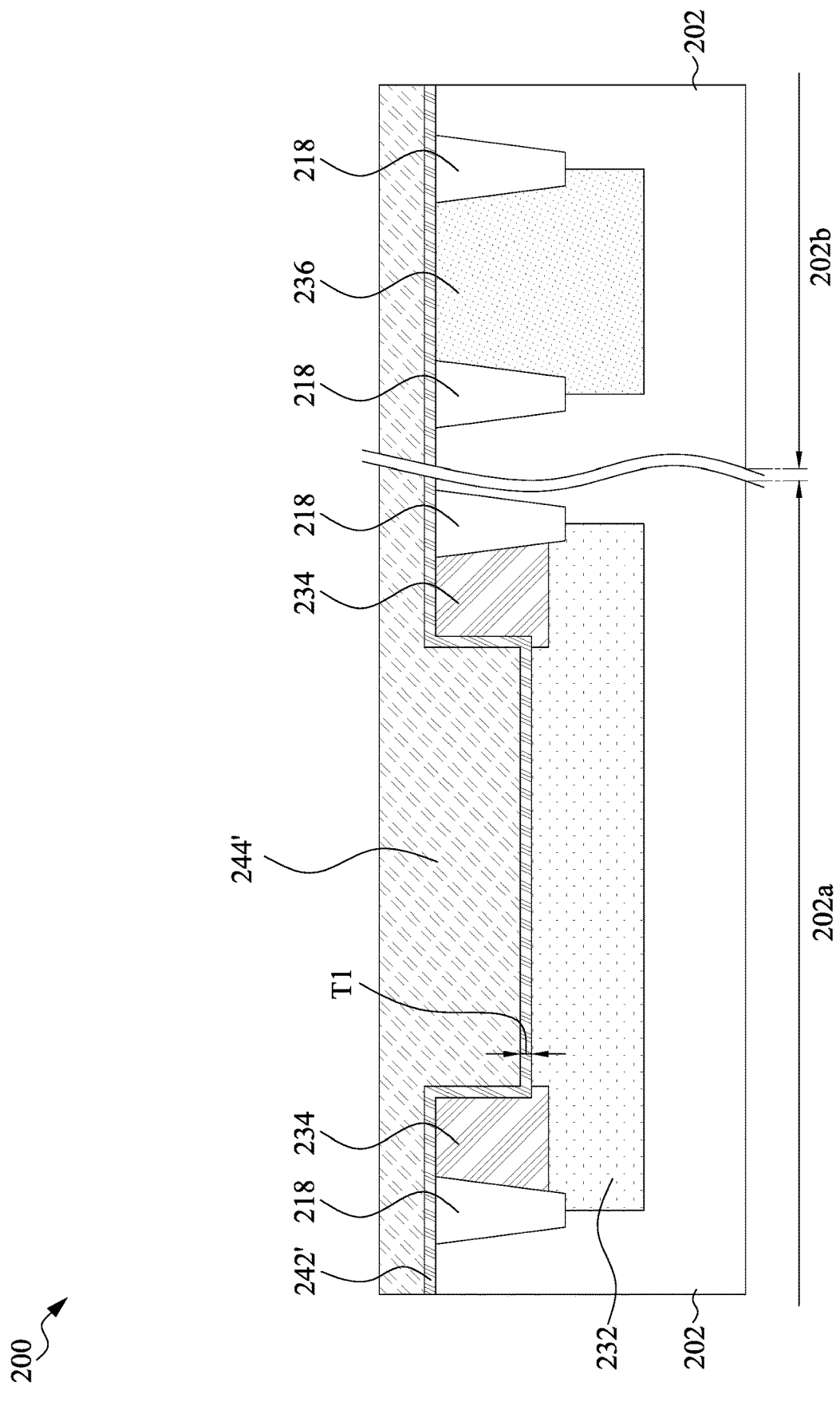
Figure 14:
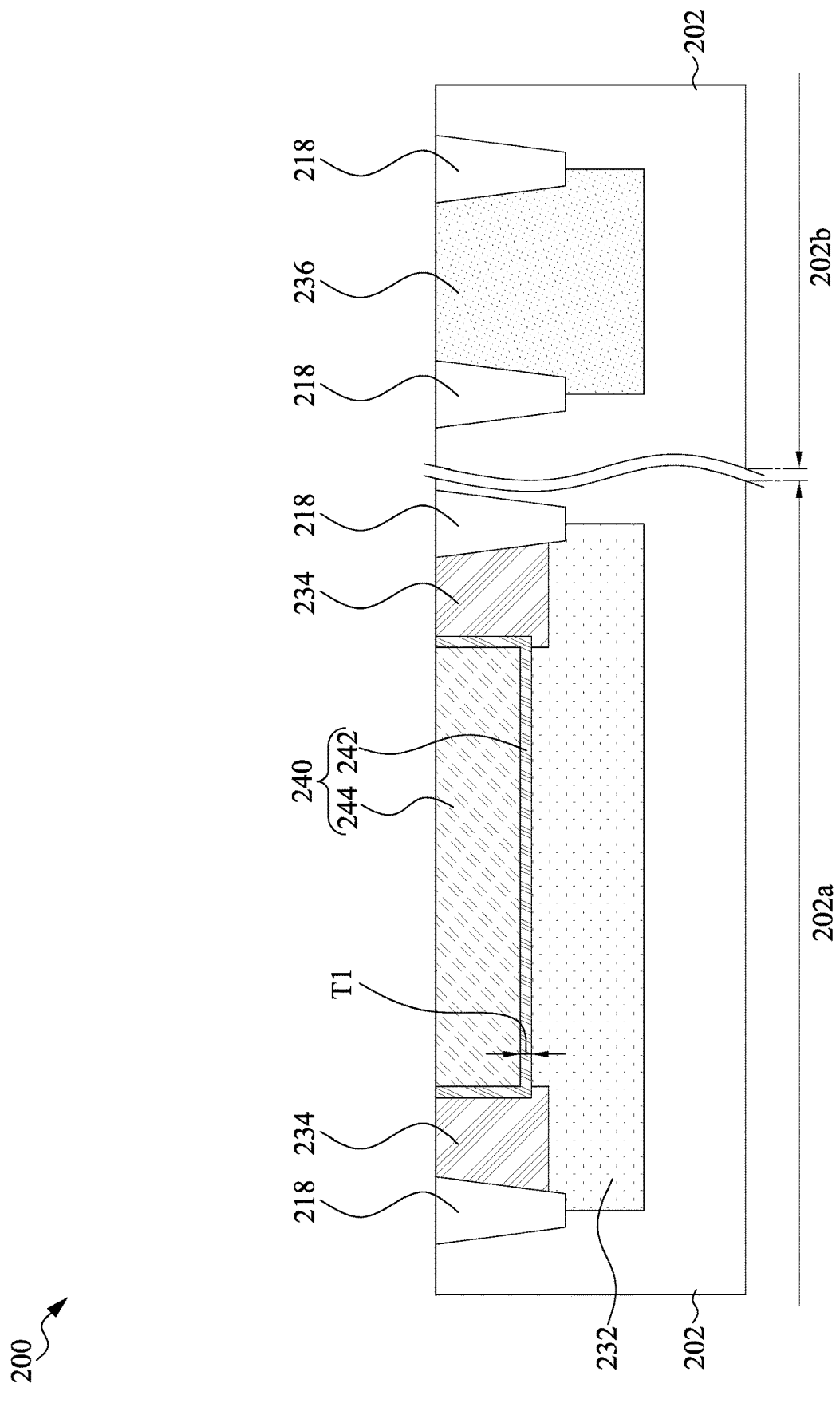

FIGS. 12 through 14 illustrate the formation of a gate structure 240 including a gate dielectric 242 and a gate electrode 244 in the first device region 202a. The respective step is shown as operation 104 of the method 100 shown in FIG. 1. Referring to FIG. 12, a gate dielectric layer 242' is formed over the substrate 202. In some embodiments, the gate dielectric layer 242' is formed over the substrate 202 in a conformal manner. The gate dielectric layer 242' is filled into the recess 224. In some embodiments, the gate dielectric layer 242' is formed to cover the sidewalls and the bottom of the recess 224. The thickness T1 of the gate dielectric layer 242' may be configured based on different requirements for different semiconductor devices. For example, when the gate dielectric 242 to be formed is used as an HV MOS device or an MV MOS device, the thickness T1 of the gate dielectric 242 is substantially in a range from about 100 angstroms (Å) to about 200 angstroms.

Referring to FIG. 13, a gate electrode layer 244' is formed over the substrate 202. In some embodiments, the gate electrode layer 244' is formed over the substrate 202 in a gap-filling manner. The gate electrode layer 244' is filled into the recess 224. The remaining portions of the recess 224 may be filled with the gate electrode layer 244'. The gate electrode layer 244' is formed from conductive material(s) such as polycrystalline silicon. In alternative embodiments, the gate electrode layer 244' is formed from doped semiconductive material e.g., doped polycrystalline silicon, or other suitable conductive materials e.g., metal.

Referring to FIG. 14, a planarization such as CMP is then performed to remove excess portions of the gate dielectric layer 242' and the gate electrode layer 244' over the top surface of the substrate 202 and the top surface of the isolation structures 218. The remaining portions of the gate dielectric layer 242' and the gate electrode layer 244' form a gate structure 240 including a gate dielectric 242 and a gate electrode 244. The gate electrode 244 is disposed within the substrate 202. The gate dielectric 242 is disposed within the substrate 202 and laterally surrounds the gate electrode 244. As shown in FIG. 14, the bottom surface of the gate structure 240 may be higher than the bottom surfaces of the isolation structures 218. In alternative embodiments, the bottom surface of the gate structure 240 is level with the bottom surfaces of the isolation structures 218. In some embodiments, a thickness of the gate electrode 244 is substantially in a range from about 700 angstroms (Å) to about 1,000 angstroms.

Figure 15:
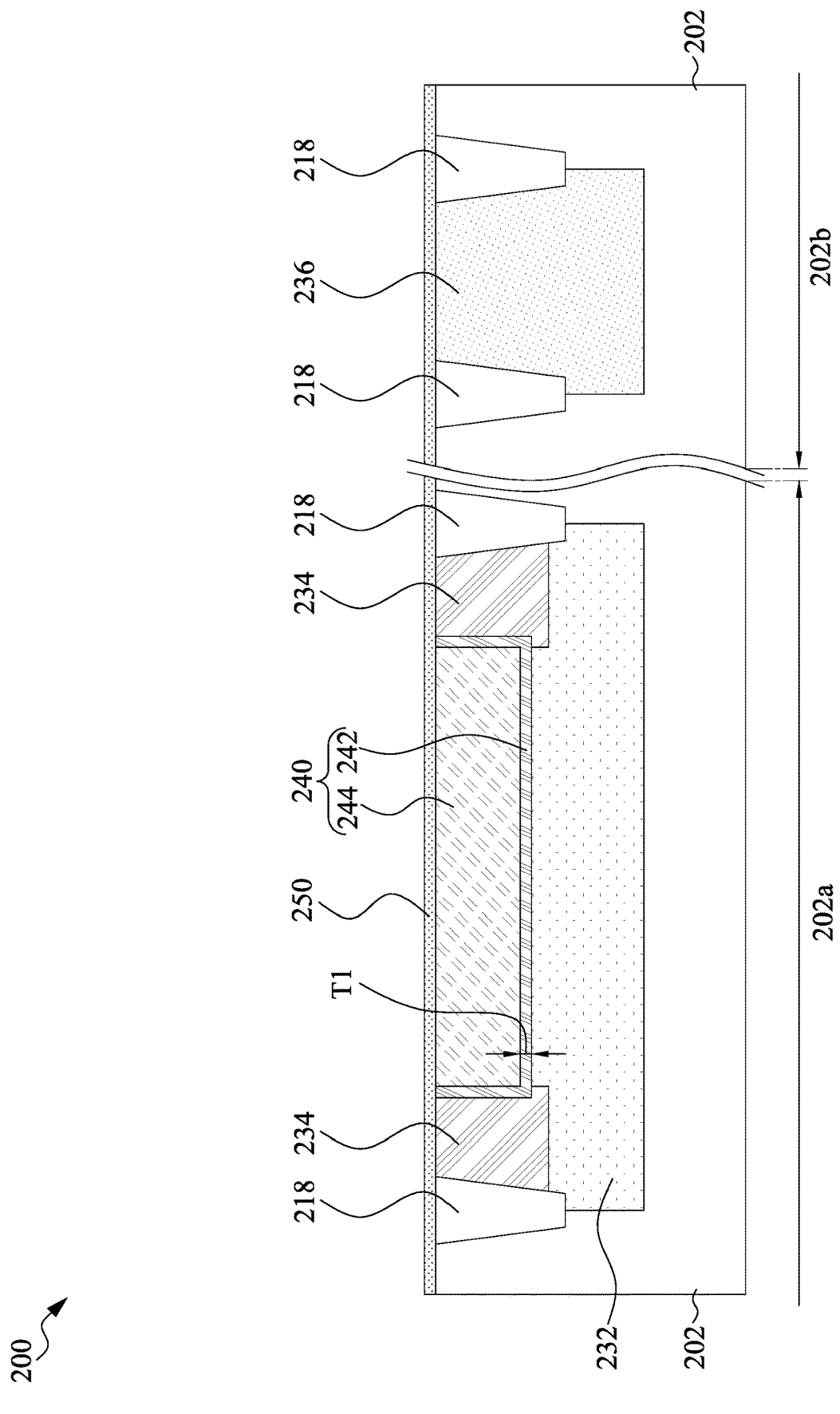
Figure 16:
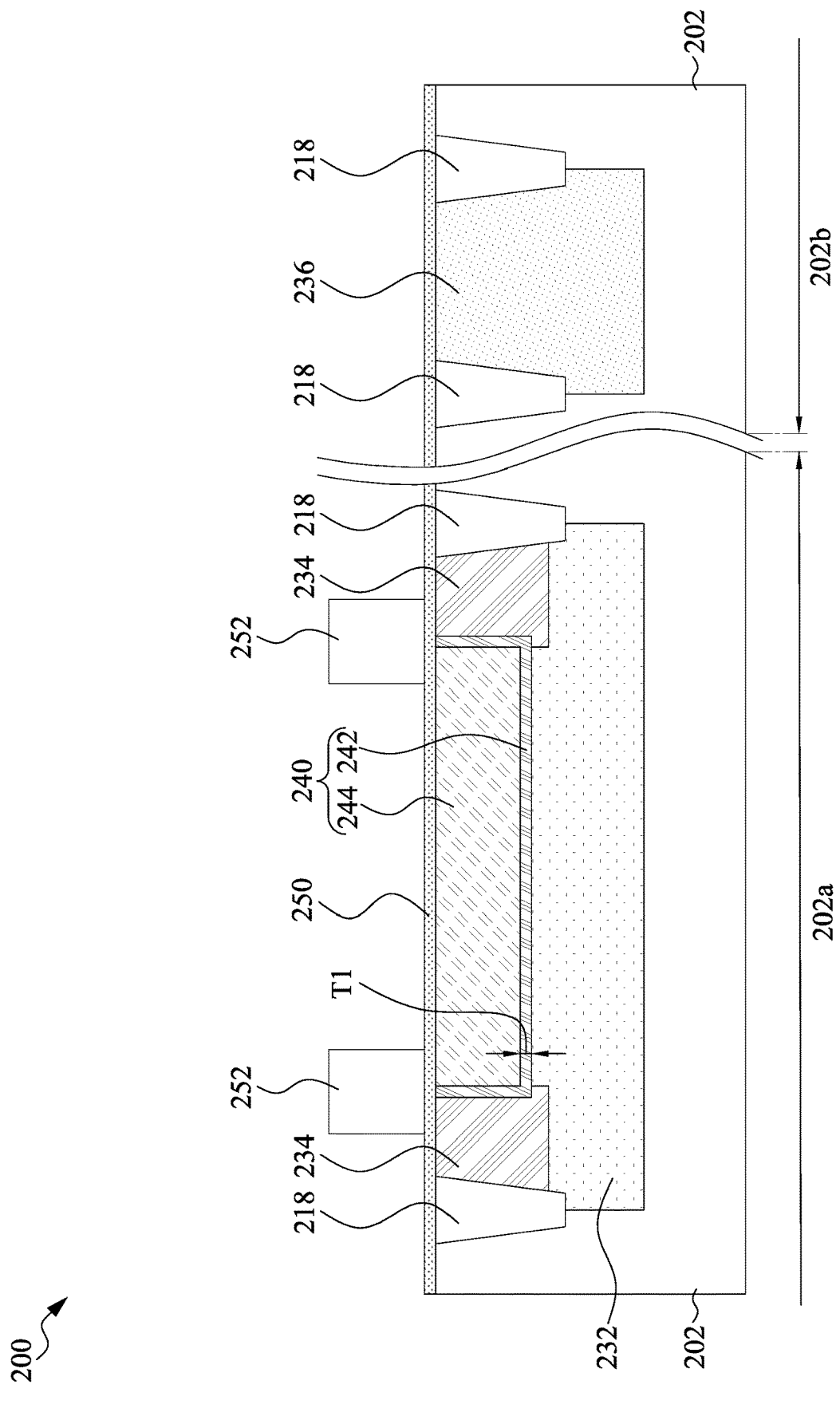
Figure 17:
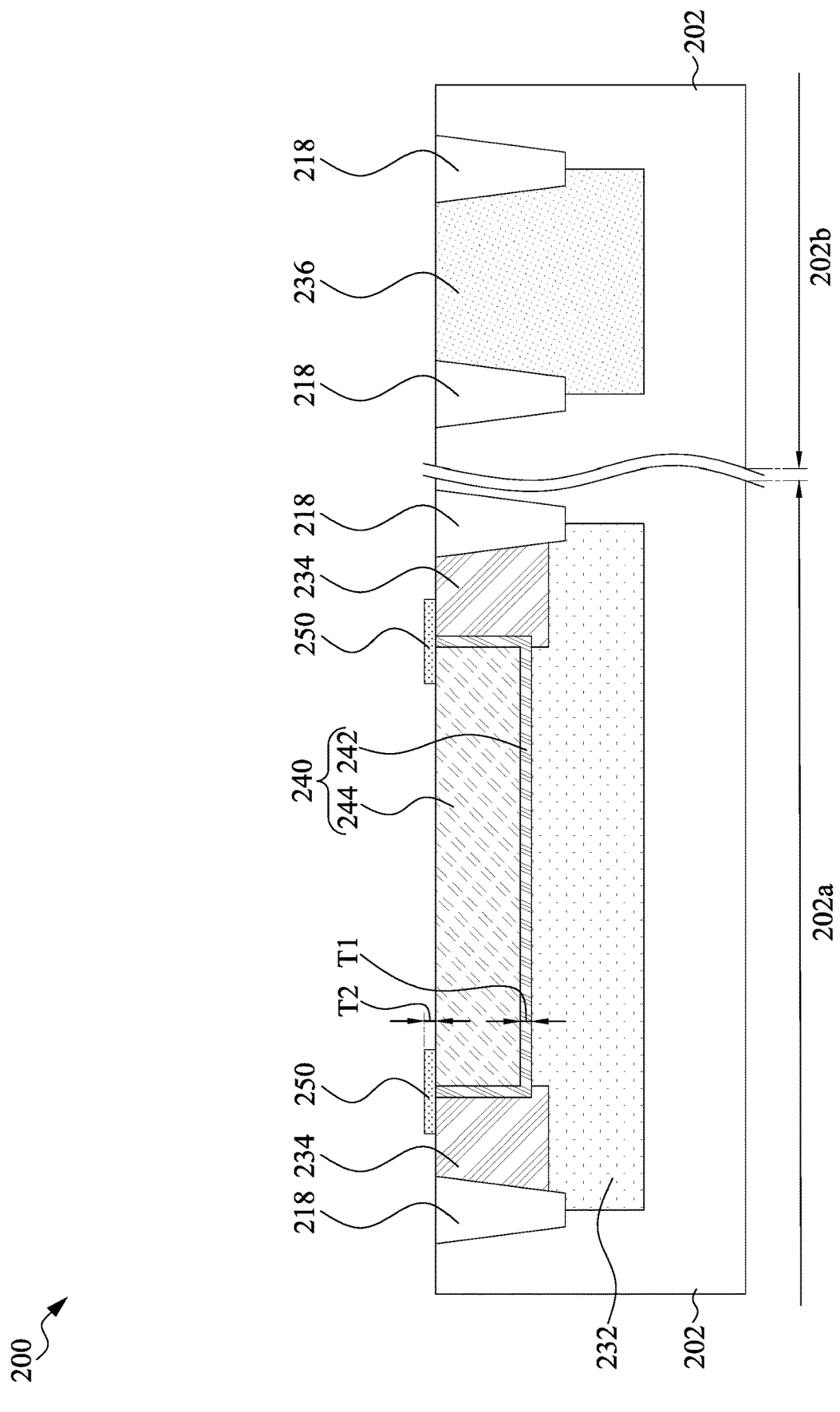

FIGS. 15 through 17 illustrate the formation of an insulating layer 250. The respective step is shown as operation 106 of the method 100 shown in FIG. 1. Referring to FIG. 15, an insulating layer 250 is formed over the substrate 202. The insulating layer 250 may cover the top surfaces of the gate structure 240. In some embodiments, the insulating layer 250 further covers the top surface of the shallow doped regions 234, the top surface of the isolation structures 218, and the top surface of the deep well region 236. The insulating layer 250 may be formed of silicon nitride. In some embodiments, the insulating layer 250 may be formed, for example, using LPCVD, thermal nitridation of silicon, PECVD, or plasma anodic nitridation. In alternative embodiments, the insulating layer 250 is formed of silicon oxide, silicon carbide, or the like. Referring to FIG. 16, a photo resist layer 252 is formed over the insulating layer 250 and is then patterned to form openings exposing portions of the insulating layer 250.

Referring to FIG. 17, the exposed portions of the insulating layer 250 are etched through the openings of the photo resist layer 252. The photo resist layer 252 is then removed. The remaining portions of the insulating layer 250 may cover a portion of the top surface of the gate dielectric 242, a portion of the top surface of the gate electrode 244 and a portion of the top surface of the shallow doped region 234. The insulating layer 250 has a thickness T2. The thickness T2 of the insulating layer 250 may be configured based on different requirements for different semiconductor devices. For example, when the first-voltage device 210a to be formed is used as a MV MOS device, the thickness T2 of the insulating layer 250 is substantially in a range from about 150 angstroms (Å) to about 300 angstroms. In some embodiments, the thickness T2 of the insulating layer 250 is substantially in a range from about 200 angstroms (Å) to about 250 angstroms.

Figure 18:
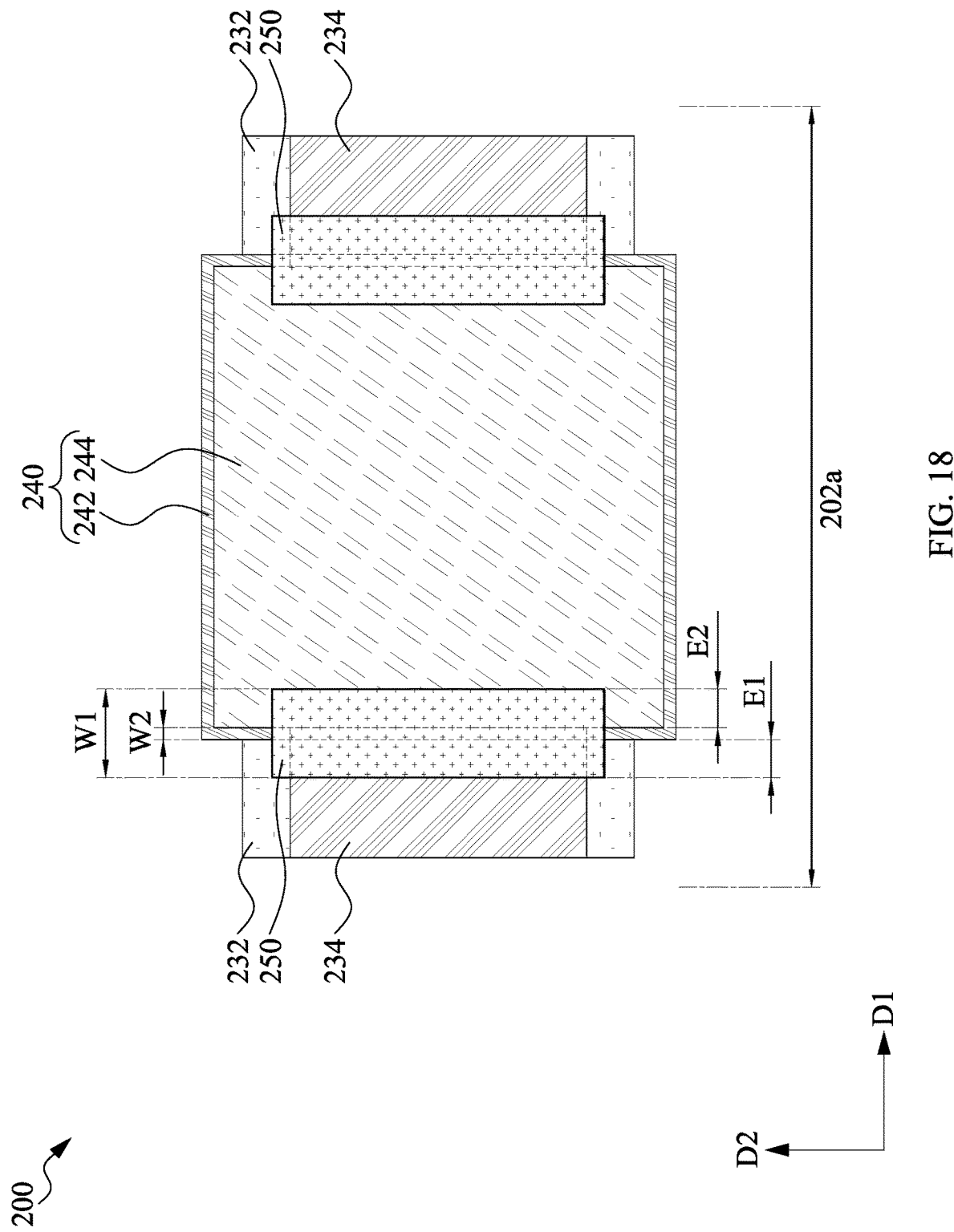

FIG. 18 illustrates a top view of the insulating layer 250, the corresponding gate structure 240, the corresponding deep well region 232 and the corresponding shallow doped region 234, in accordance with some embodiments of the present disclosure. The deep well region 232 extends in a first direction D1 within the substrate 202. In some embodiments, the gate structure 240 overlaps the deep well region 232 and extends in a second direction D2 different from the first direction D1. The second direction D2 may be perpendicular to the first direction D1.

As shown in FIG. 18, the insulating layer 250 overlaps a portion of the top surface of the gate dielectric 242 in a top-view perspective. The insulating layer 250 may extend in the second direction D2. In alternative embodiments, the insulating layer 250 overlaps the entire top surface of the gate dielectric 242. For example, the insulating layer 250 may have a ring-shaped overlapping the entire top surface of the gate dielectric 242. In some embodiments, the insulating layer 250 has a width W1 greater than a width W2 (equal to thickness T1) of the gate dielectric 242. In some embodiments, the width W1 is greater than or substantially equal to 0.25 μm. The insulating layer 250 may further have an extension width E1 overlapping a portion of the top surface of the shallow doped region 234 and a portion of the top surface of the deep well region 232. In some embodiments, the extension width E1 is greater than or substantially equal to 0.125 μm. The insulating layer 250 may further have an extension width E2 overlapping a portion of the top surface of the gate electrode 244. In some embodiments, the extension width E2 is less than or substantially equal to the extension width E1. In some embodiments, the extension width E2 may be greater than or substantially equal to 0.125 μm. The width W1, the width W2, the extension width E1 and the extension width E2 may be configured based on different requirements for different semiconductor devices.

Figure 19:
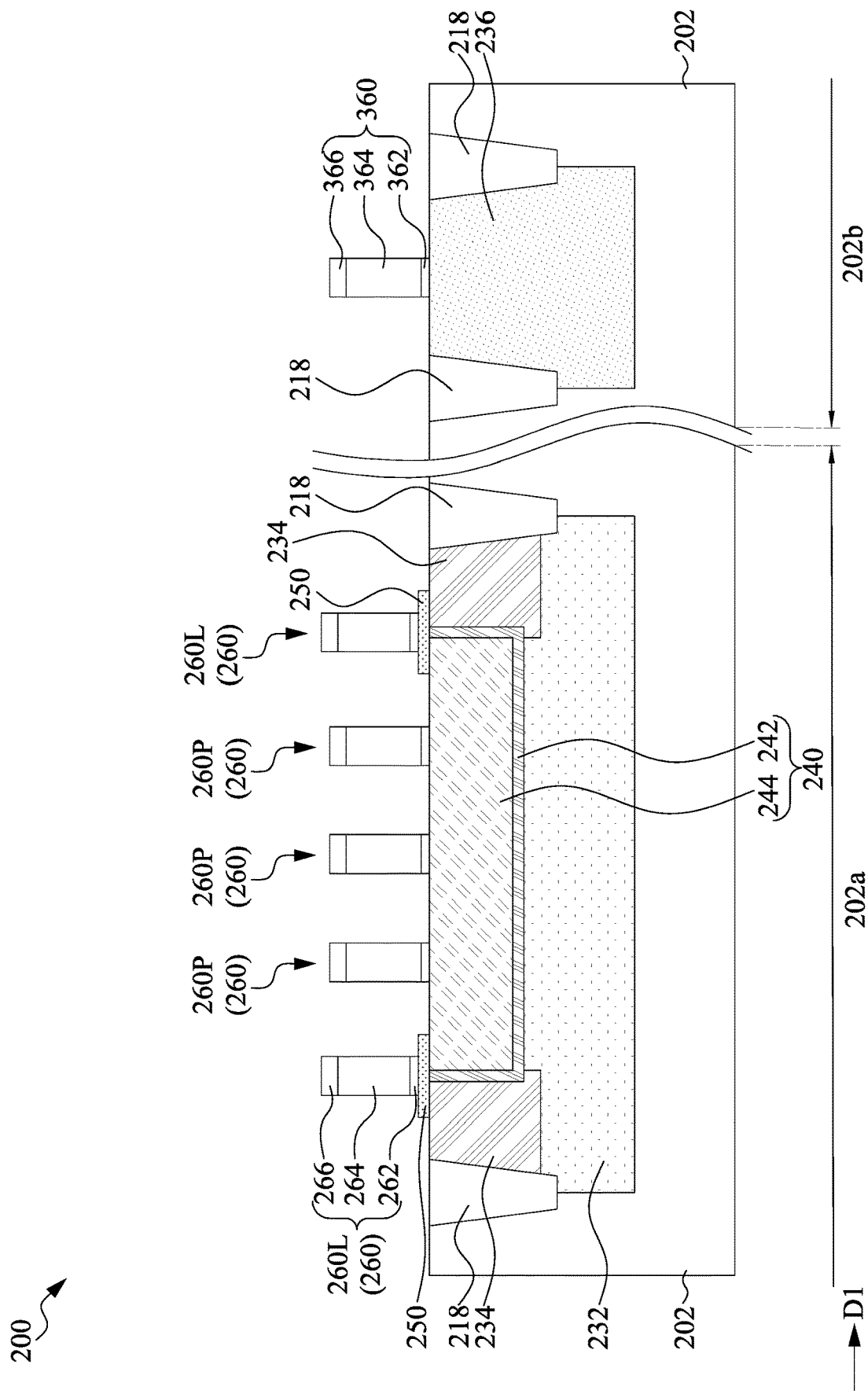

Next, referring to FIG. 19, gate stacks 260 and 360 are formed in the first device region 202a and the second device region 202b, respectively. The respective step is shown as operation 108 of the method 100 shown in FIG. 1. The gate stacks 260 and 360 may be removed in subsequent steps and replaced by their respective replacement gates. Accordingly, the gate stacks 260 and 360 are dummy gates in accordance with some embodiments. The gate stack 260 includes a gate dielectric 262 and a gate electrode 264. The gate stack 360 includes a gate dielectric 362 and a gate electrode 364. The gate dielectrics 262 and 362 may be formed of silicon oxide, silicon nitride, silicon carbide, or the like. The gate electrodes 264 and 364 may include conductive layers. The gate electrodes 264 and 364 may include polysilicon in accordance with some embodiments. The gate electrodes 264 and 364 may also be formed of other conductive materials such as metals, metal alloys, metal silicides, metal nitrides, and/or the like. In some embodiments, the gate stacks 260 and 360 further include hard masks 266 and 366, respectively. The hard mask 266 and 366 may be formed of silicon nitride, for example, while other materials such as silicon carbide, silicon oxynitride, and the like may also be used. In accordance with alternative embodiments, the hard masks 266 and 366 are not formed.

Referring to the first device region 202a, at least two gate stacks 260L are formed on the insulating layer 250. The top surfaces of the gate stacks 260L formed on the insulating layer 250 may be higher than the top surfaces of the gate stacks 260P formed over the gate electrode 244 of the gate structure 240. In some embodiments, the top surfaces of the gate stacks 260P formed over the gate electrode 244 of the gate structure 240 are substantially level with the top surfaces of the gate stacks 360 formed in the second device region 202b.

Figure 20:
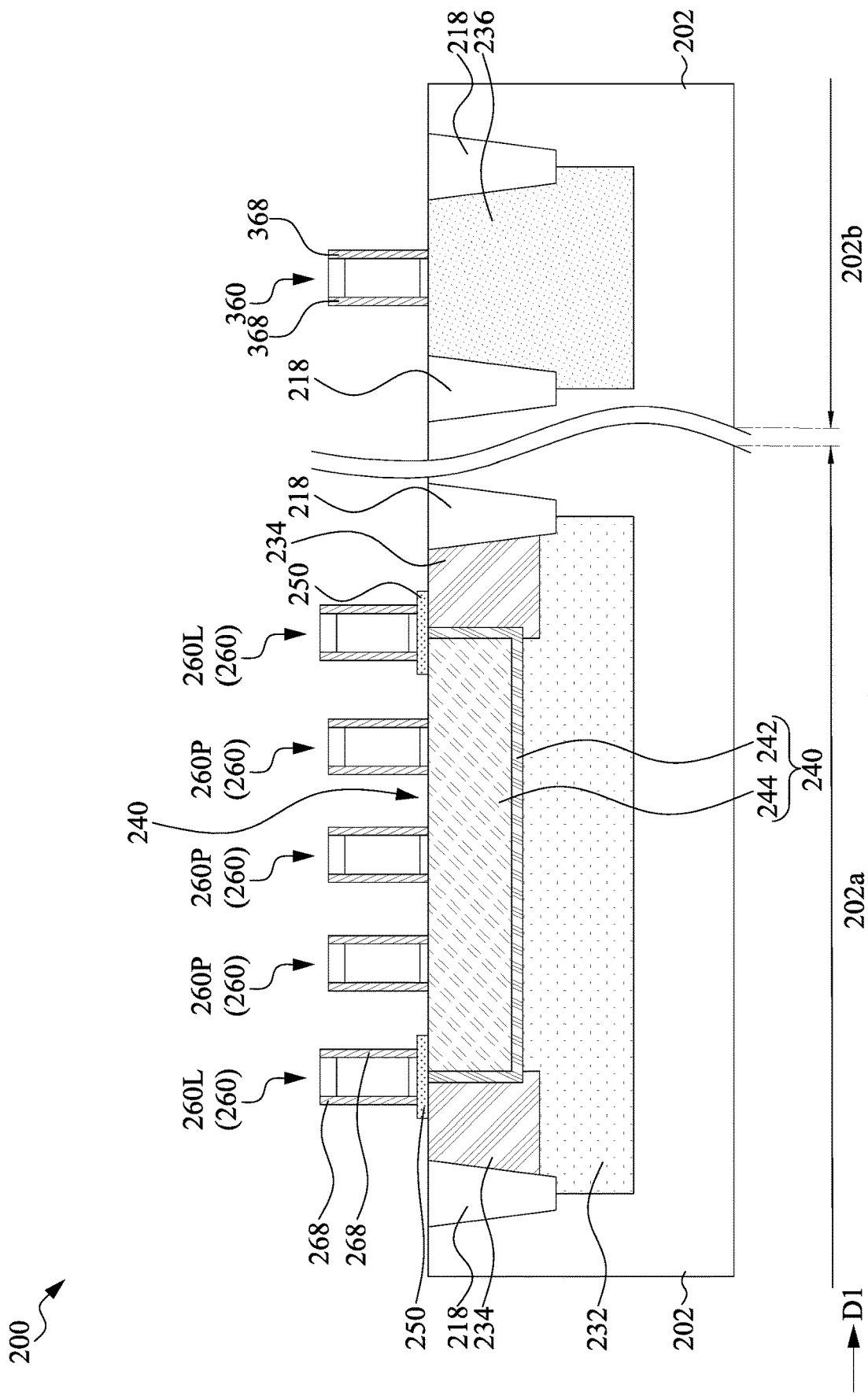

Referring to FIG. 20, gate spacers 268 and 368 are formed on the sidewalls of the gate stacks 260 and 360, respectively. In accordance with some embodiments, each of the gate spacers 268 and 368 includes a silicon oxide layer and a silicon nitride layer on the silicon oxide layer. The formation may include depositing blanket dielectric layers, and then performing an anisotropic etching to remove the horizontal portions of the blanket dielectric layers. The available deposition methods include PECVD, LPCVD, Sub-Atmospheric Chemical Vapor Deposition (SACVD), and other deposition methods.

Figure 21:
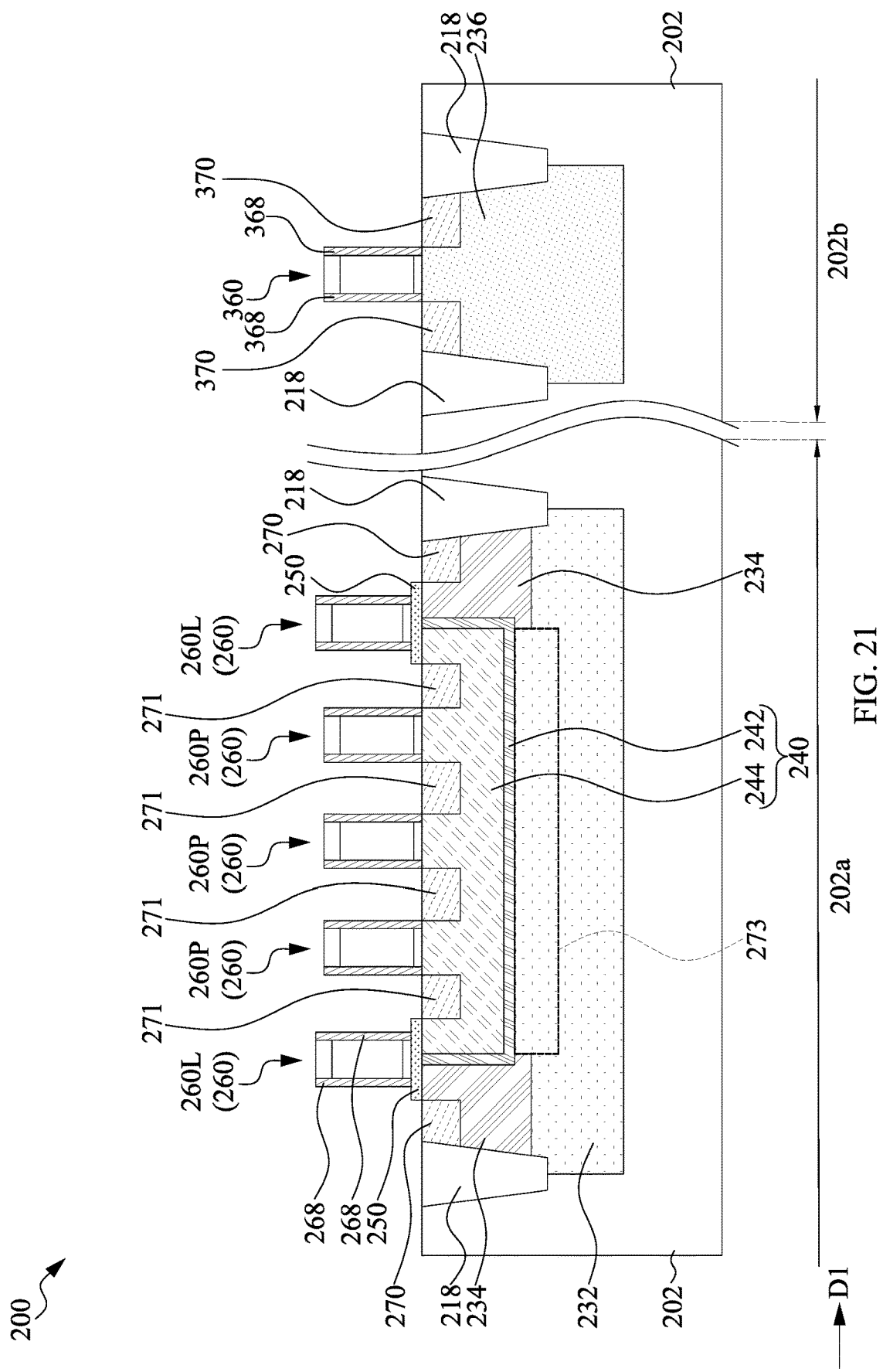

Referring to FIG. 21, source regions and drain regions (collectively referred to as source/drain regions hereinafter) 270 and 370 are formed in the first device region 202a and the second device region 202b. Further, doped regions 271 may be formed in the first device region 202a. In addition, the source/drain regions 270 and 370, and the doped regions 271 may be formed in a single formation process, and thus have the same depth, and are formed of the same materials.

Referring to the first device region 202a, the source/drain regions 270 may be formed in the shallow doped regions 234, and doped regions 271 may be formed in the gate electrode 244. One of the source/drain regions 270 formed in the shallow doped regions 234 serves as the source region, and the other one of the source/drain regions 270 formed in the shallow doped regions 234 serves as the drain region. A channel 273 is formed directly underlying the gate dielectric 242 for conducting current between the source/drain regions 270. The channel 273 may be formed in the upper portion of the deep well region 232. The doped regions 271 formed in the gate electrode 244 may serve as a doped region 272 (see FIG. 22) of the gate electrode 244. Referring to the second device region 202b, the source/drain regions 370 are formed in the deep well region 236.

The source/drain regions 270 and 370, and the doped regions 271 may be formed simultaneously in a same implantation process. In some embodiments, the source/drain regions 270 and 370, and the doped regions 271 are of n-type, and are heavily doped, and thus are referred to as N+ regions. In some embodiments, a photo resist (not shown) is formed over the substrate 202 to define the location of the source/drain regions 270 and 370, and the doped regions 271. The source/drain regions 270 may be spaced apart from the gate dielectric 242 by the insulating layer 250. Further, the source/drain regions 270 and 370 may have edges aligned to the edges of the gate spacers 268 and 368, respectively. The source/drain regions 270 may further have edges aligned to the edges of the insulating layer 250. The doped regions 271 may have edges aligned to the edges of the gate spacers 268. Further, a portion of the doped regions 271 may have edges aligned to the edges of the insulating layer 250.

Figure 22:
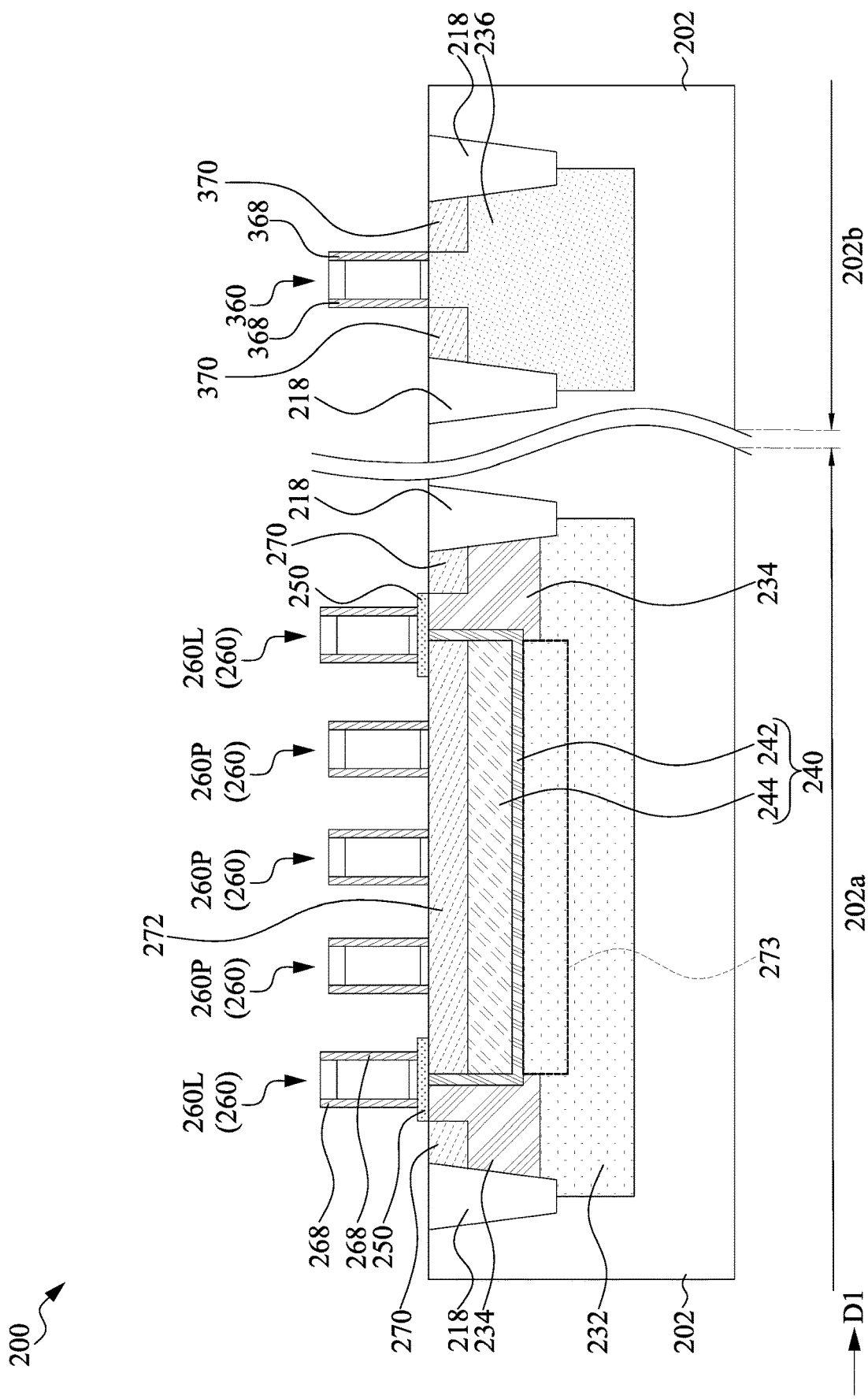

Next, referring to FIG. 22, an annealing operation may be performed. The annealing operation may include annealing the structure shown in FIG. 21 at an elevated temperature. The annealing operation may facilitate activation of the dopants in the doped regions 271 formed in the gate electrode 244, resulting a doped region 272 of the gate electrode 244. The presence of the doped region 272 may help alleviating the polysilicon depletion effect of the gate electrode 244. Unlike the general polysilicon pre-doping approaches, where a polysilicon gate electrode is doped directly after the formation of the poly silicon gate electrode with independent photolithography operations, the doped region 272 is formed with the formation of the source/drain regions 270 and 370. Hence, the manufacturing operations can be simplified, and the production costs can be reduced.

Figure 23:
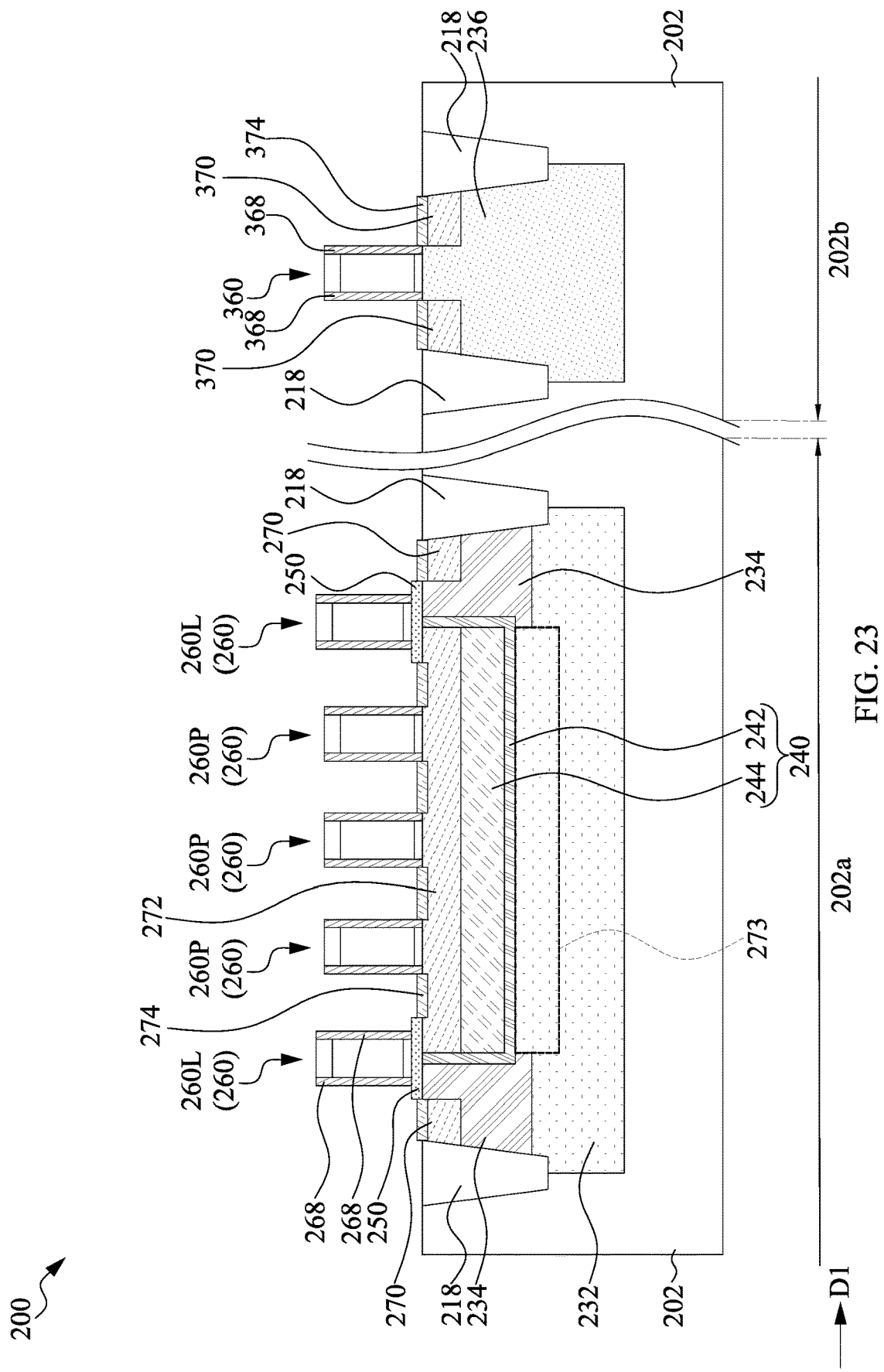

Referring to FIG. 23, silicide regions 274 and 374 are formed in the first device region 202a and the second device region 202b, respectively. The formation process may include forming a resist protective oxide (RPO) over portions of the substrate 202 that are not protected by the gate spacers 268 and 368, and the insulating layer 250. The RPO may function as a silicide blocking layer during the formation of the silicide regions 274 and 374. The silicide regions 274 and 374 may be formed using silicidation such as self-aligned silicide (salicide), in which a metallic material is formed over the substrate 202, the temperature is raised to anneal the substrate 202 and cause reaction between underlying silicon of the substrate 202 and the metal to form silicide, and un-reacted metal is etched away. The silicide regions 274 and 374 may be formed in a self-aligned manner on various features, such as the source/drain regions 270 and 370 and/or the doped region 272 of the gate electrode 244, to reduce contact resistance.

Figure 24:
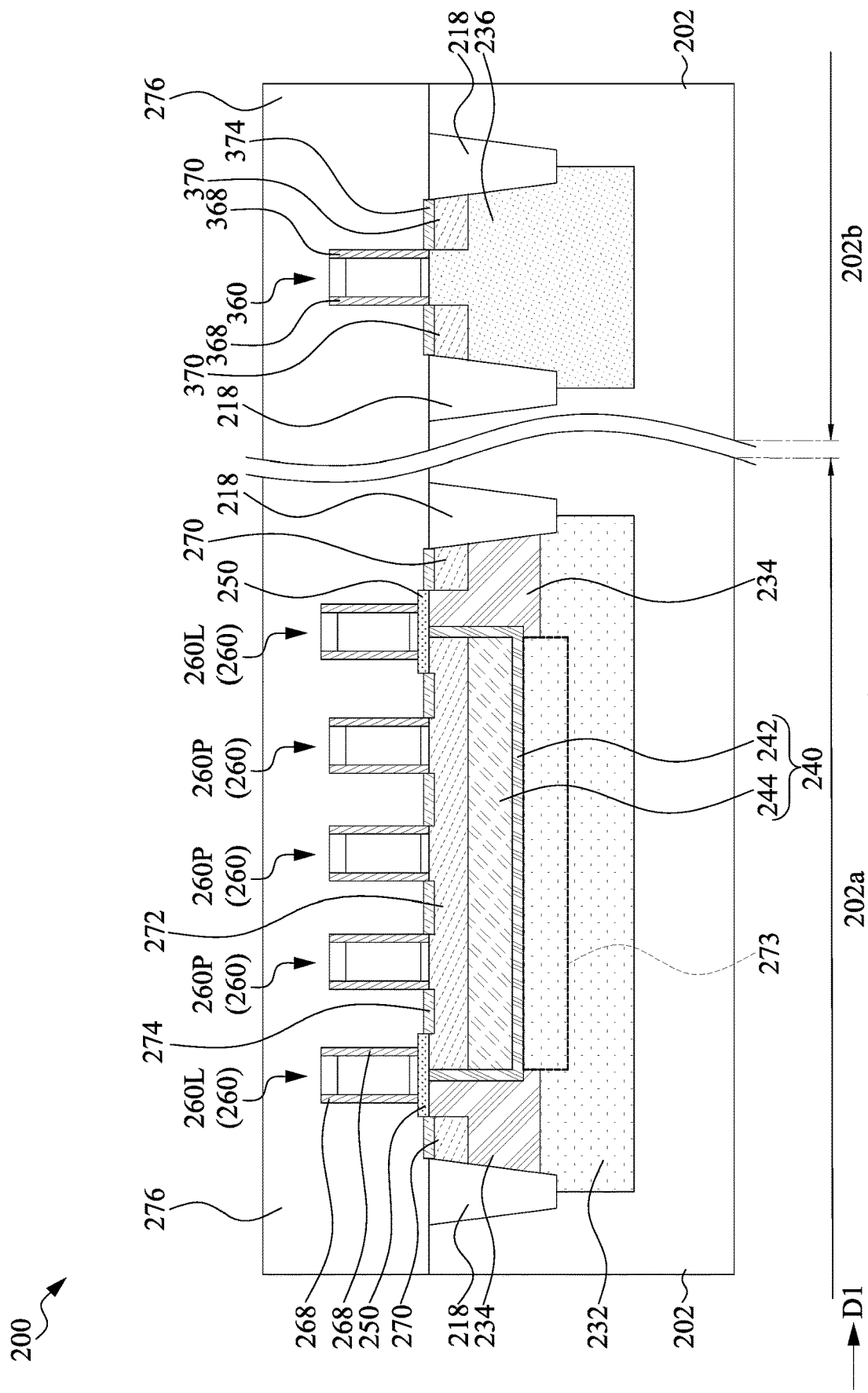

Referring to FIG. 24, an inter-layer dielectric (ILD) layer 276 is formed over the substrate 202. The ILD layer 276 is blanket formed to a height higher than the top surfaces of the gate stacks 260 and 360. The ILD layer 276 may be formed of an oxide using, for example, flowable chemical vapor deposition (FCVD). The ILD layer 276 may also be a spin-on glass formed using spin-on coating. For example, the ILD layer 276 may be formed of phospho-silicate glass (PSG), boro-silicate glass (BSG), boron-doped phospho-silicate glass (BPSG), tetraethyl orthosilicate (TEOS) oxide, TiN, SiOC, or other low-k dielectric materials.

Figure 25:
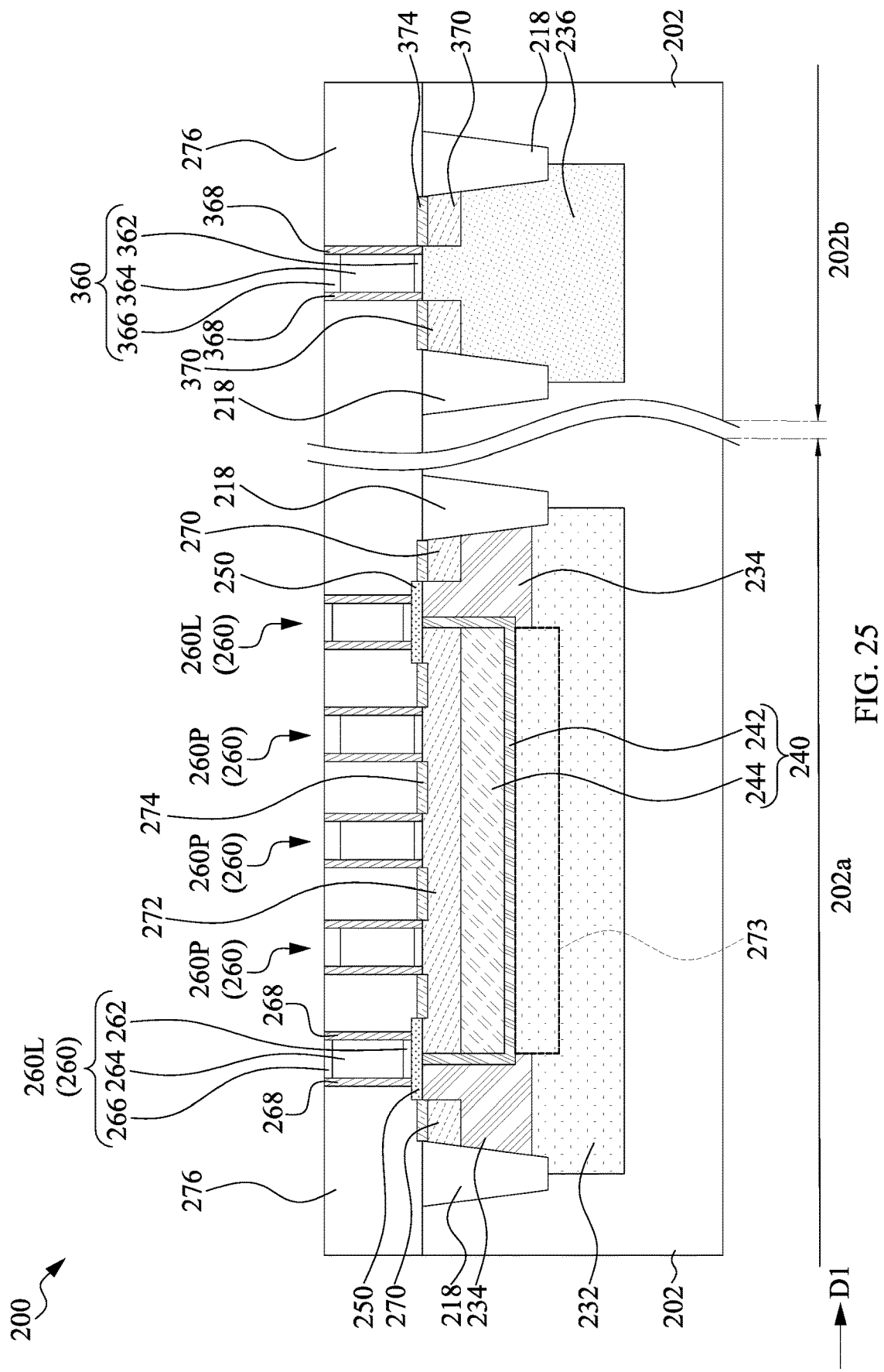

Referring to FIG. 25, FIG. 25 illustrates a planarization step, which is performed using, for example, CMP. The CMP is performed to remove excess portions of the ILD layer 276, until the gate stack 360 is exposed. Since the gate stacks 260L are formed on the insulating layer 250, the top surface of the gate stacks 260L formed on the insulating layer 250 are higher than the top surface of the gate stack 360. The top surface of the gate stacks 260L formed on the insulating layer 250 are also higher than the top surface of the gate stacks 260P formed on the gate electrode 244. Accordingly, in the planarization, the top portion of the gate stacks 260L formed on the insulating layer 250 is removed, and the height of the remaining gate stack 260L is smaller than the height of remaining gate stack 360. On the other hand, the top portion of the gate stacks 260P formed on the gate electrode 244 is not removed during the planarization, and the height of the remaining gate stacks 260P formed on the gate electrode 244 is substantially same as the height of remaining gate stack 360. The planarization may be stopped on the hard masks 266 and 366, if they are present. Alternatively, the hard masks 266 and 366 are removed in the planarization, and the gate electrodes 264 and 364 are exposed.

Figure 26:
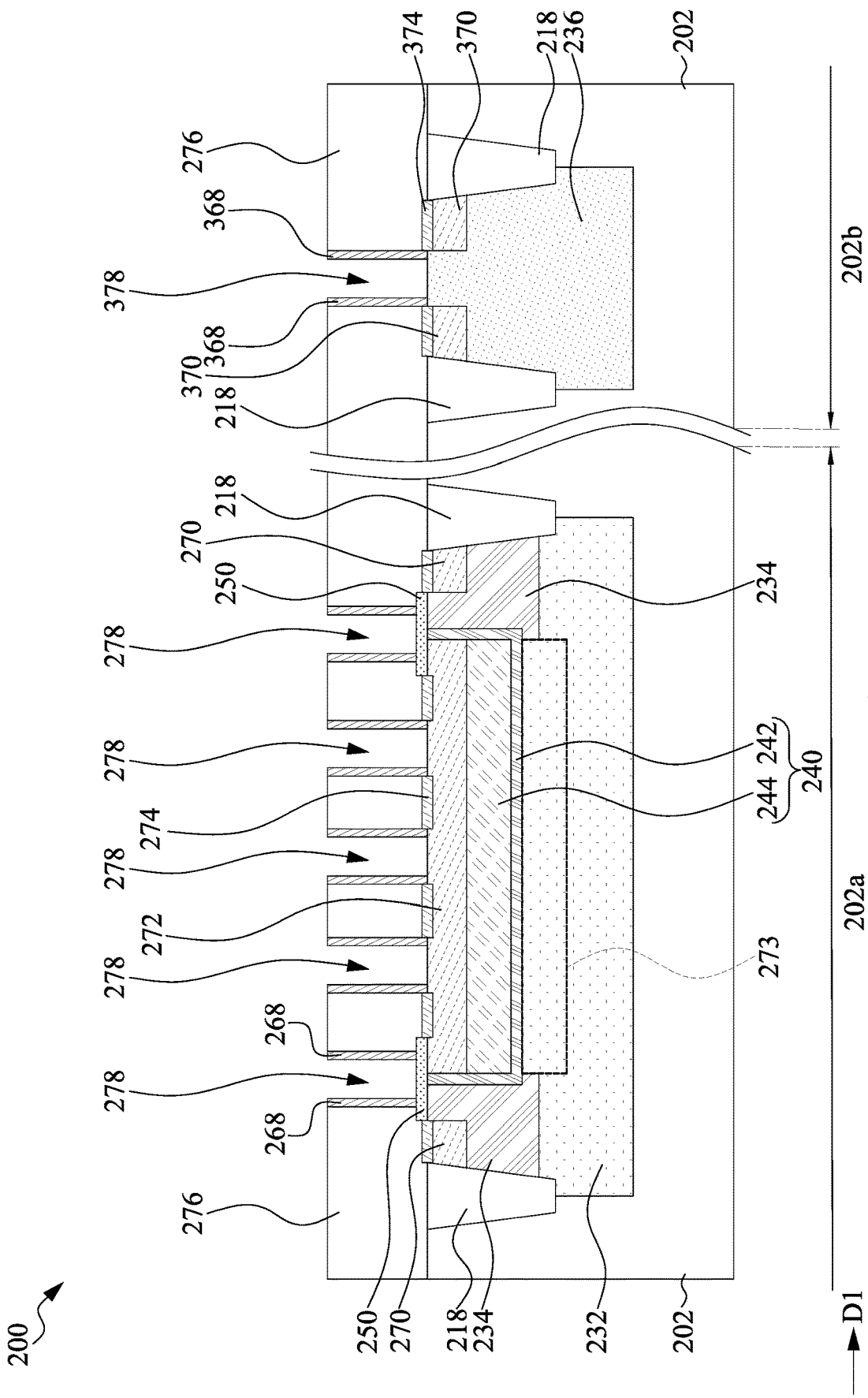
Figure 27:
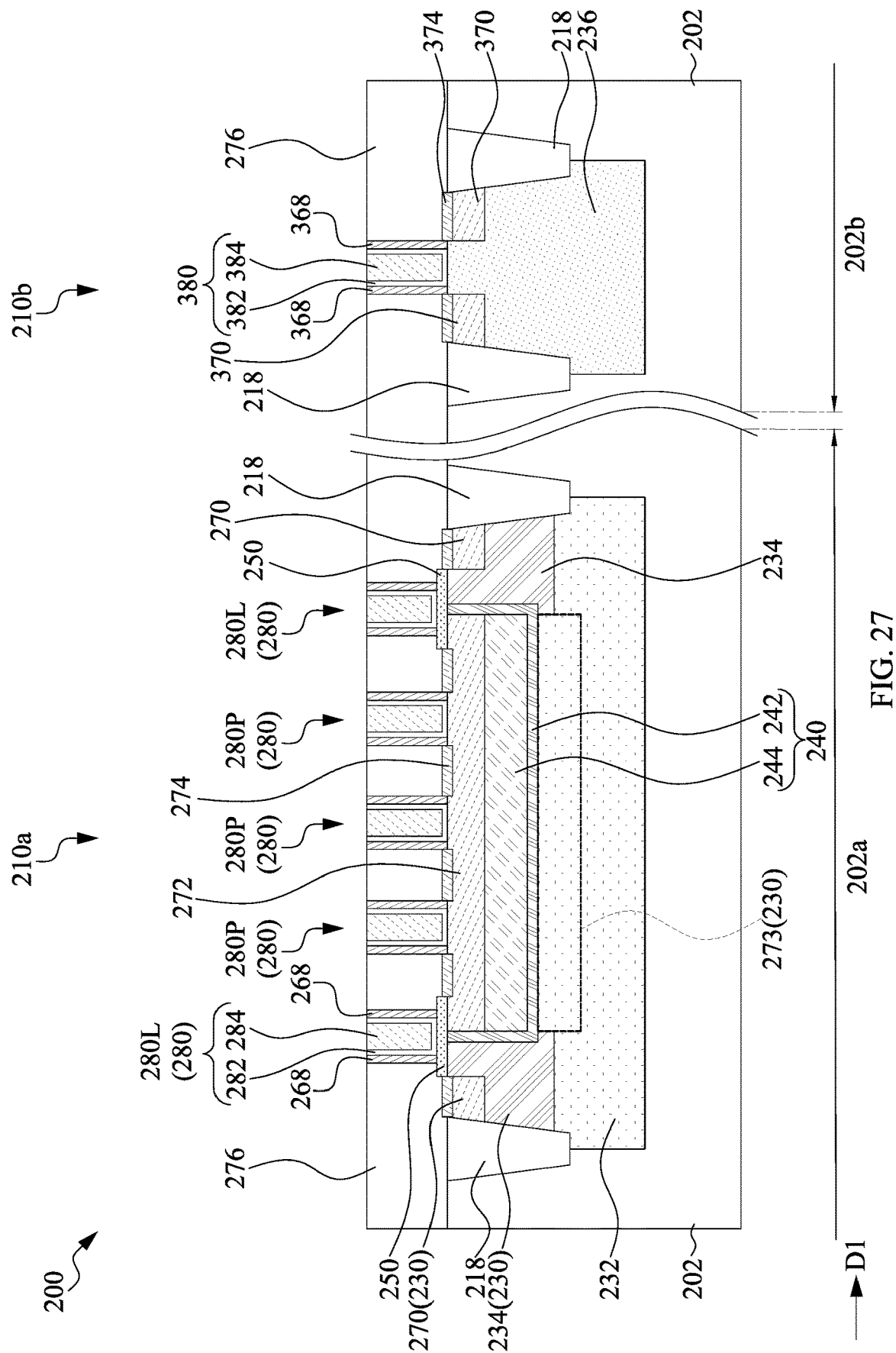

FIGS. 26 and 27 illustrate the formation of replacement gate stacks 280 and 380 in accordance with some embodiments. Referring to FIG. 25, the gate stacks 260 and 360 (FIG. 25) are removed. In some embodiments, the gate stacks 260 and 360 are removed to form gate trenches 278 and 378 in the ILD layer 276, respectively. In some embodiments, a dry etching operation is performed to remove the gate stacks 260 and 360. In some embodiments, the dry etching operation uses F-containing plasma, Cl-containing plasma and/or Br-containing plasma to remove the gate stacks 260 and 360.

It should be understood that the substrate 202 may include various device regions, and the various device regions may include various n-type or p-type FET devices and one or more passive devices such as a resistor. It should be also understood that different devices may require different types of elements. In some embodiments, when an I/O FET device is used, the gate dielectrics 262 and 362 (FIG. 25) can respectively serve as an interfacial layer (IL). Thus, the gate dielectrics 262 and 362 may not be removed. In alternative embodiments, when a core FET device is used, the gate dielectrics 262 and 362 are removed to thereby expose the substrate 202 to the gate trenches 278 and 378, respectively.

Referring to FIG. 27, the gate stacks 260 and 360 (FIG. 25) are replaced by replacement gate stacks 280 and 380, respectively. The gate stack 280 includes a gate dielectric 282 and a gate electrode 284. The gate stack 380 includes a gate dielectric 382 and a gate electrode 384. The gate dielectrics 282 and 382 may include a high-k dielectric material such as hafnium oxide, lanthanum oxide, aluminum oxide, or the like. In addition, the gate dielectrics 282 and 382 may be formed in a single formation process, and thus have the same thicknesses, and are formed of the same dielectric materials.

The gate electrodes 284 and 384 may include conductive layers. In some embodiments, the gate electrodes 284 and 384 may include at least a barrier metal layer, a work functional metal layer and a gap-filling metal layer. The barrier metal layer may include, for example but not limited to, TiN. The work function metal layer may include a single layer of TiN, TaN, TaAlC, TiC, TaC, Co, Al, TiAl, HfTi, TiSi, TaSi or TiAlC, or a multilayer of two or more of these materials, but is not limited to the above-mentioned materials. In some embodiments, the gap-filling metal layer includes a conductive material such as Al, Cu, AlCu, or W, but is not limited to the above-mentioned materials. The formation methods include PVD, CVD, or the like. In addition, the gate electrodes 284 and 384 may be formed in a single formation process, and are formed of the same dielectric materials.

A planarization operation (for example, a CMP) is then performed to remove excess portions of the gate dielectrics 282 and 382, and gate electrodes 284 and 384, leaving the structure shown in FIG. 27. Referring to the first device region 202a, at least two gate stacks 280L are formed on the insulating layer 250. Since the gate stacks 280L are formed on the insulating layer 250, the height of the gate stacks 280L formed on the insulating layer 250 are shorter than the height of the gate stacks 280P formed on the gate electrode 244. The height of the gate stacks 280L formed on the insulating layer 250 are also shorter than the height of the gate stack 360.

As shown in FIG. 27, the gate dielectric 282 of the gate stacks 280P contacts and overlaps the gate electrode 244, while the gate dielectric 282 of the gate stacks 280L contacts the insulating layer 250 and overlaps the gate dielectric 242. In some embodiments, the gate stacks 280P are electrically floated. In some embodiments, the gate stacks 280P may be electrically connected to the gate structure 240. In some embodiments, the gate stacks 280L are electrically isolated from the gate structure 240 by the insulating layer 250. The gate stacks 280P are separated from each other. At least one of the gate stacks 280L is between the gate stacks 280P and the gate stack 360. The gate electrode 284 of the gate stack 280L overlaps the gate dielectric 242. The insulating layer 250 is disposed between the gate electrode 284 of the gate stack 280L and the gate dielectric 242. In some embodiments, at least a portion of the gate electrode 284 of the gate stack 280L overlaps the gate electrode 244.

In some embodiments, more gate stacks 360 are formed in the second device region 202b. The gate stacks 280P and the gate stacks 360 may be collectively referred to as a plurality of gate structures of LV MOS devices. The gate stacks 280P may be referred to as a first subset of the gate structures, while the gate stacks 360 may be referred to as a second subset of the gate structures. At least one of the gate stacks 280L is between the gate stacks 280P and the gate stacks 360. Accordingly, the first subset and the second subset are separated by the gate stacks 280P.

Figure 28:
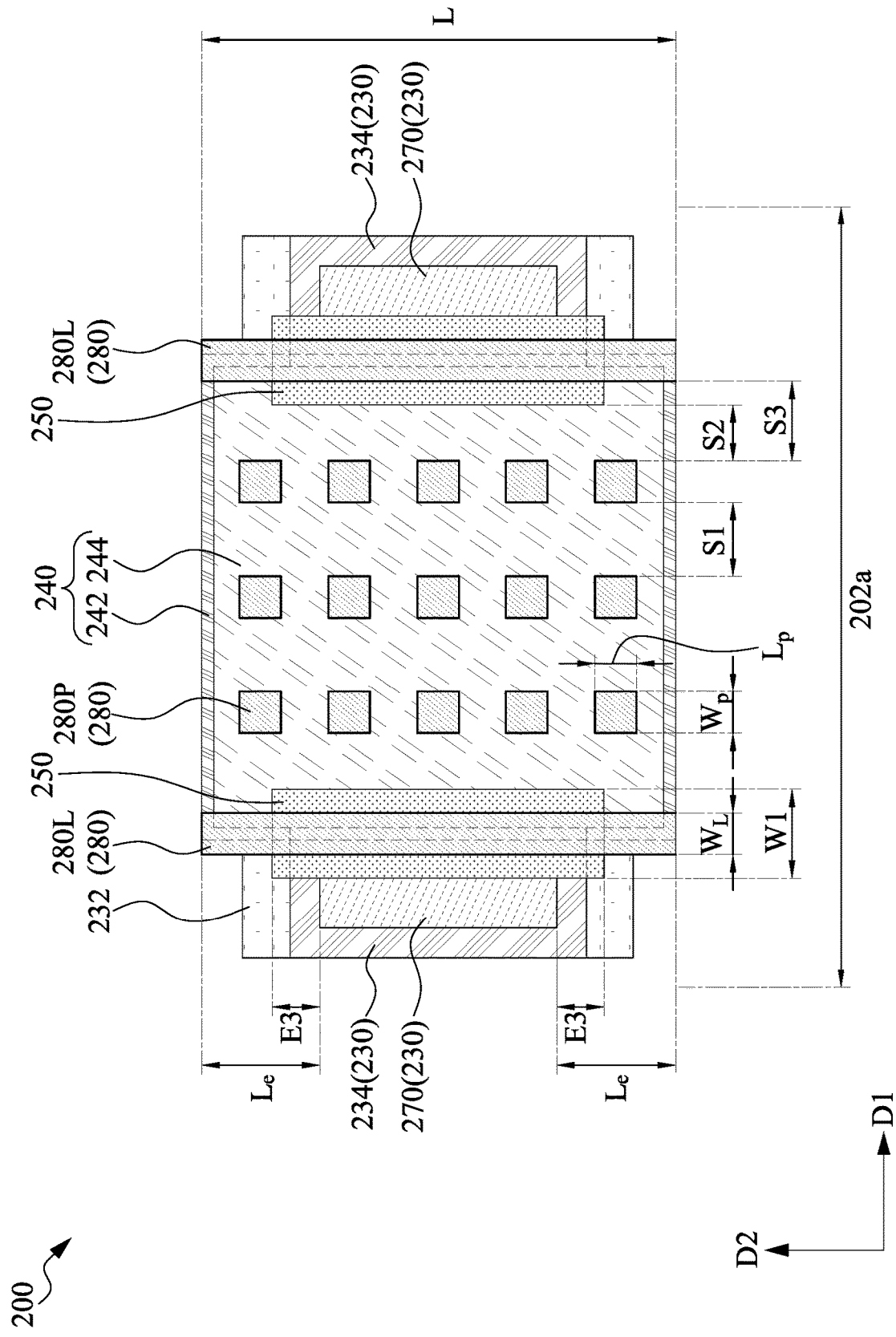

FIG. 28 illustrates a top view of the gate stacks 280P and 280L, the insulating layer 250, the gate structure 240 and the source/drain regions 270 according to aspects of one or more embodiments of the present disclosure. The gate stacks 280L and 280P may have different configurations. For example, the gate stack 280P may have a width $W_p$ and the gate stack 280L may have a width $W_L$. The width $W_p$ and the $W_L$ may be substantially the same. In alternative embodiments, the width $W_p$ is greater than the width $W_L$. The width $W_p$ may be in the range between about 0.2 μm and about 0.6 μm in accordance with some embodiments. The width $W_L$ may be in the range between about 0.1 μm and about 0.3 μm in accordance with some embodiments. The width $W_p$ and the width $W_L$ may be configured based on different requirements for different semiconductor devices.

The gate stacks 280P land on the gate electrode 244. Each of the gate stacks 280P overlaps the gate electrode 244. The gate stack 280P may further have a length $L_p$. In some embodiments, the length $L_p$ and width $W_p$ are substantially identical. In alternative embodiments, the length $L_p$ and width $W_p$ are different. A spacing S1 is arranged between two adjacent gate stacks 280P. The spacing S1 may be in the range between about 0.2 μm and about 0.6 μm in accordance with some embodiments. A spacing S2 is arranged between the insulating layer 250 and the neighboring gate stack 280P. In some embodiments, the spacing S2 is greater than or substantially equal to 0.05 μm. The length $L_p$, the spacing S1 and the spacing S2 may be configured based on different requirements for different semiconductor devices.

The gate stacks 280L land on the insulating layer 250. The insulating layer 250 is between the gate stack 280L and the gate dielectric 242. In some embodiments, an area of the insulating layer 250 is less than or substantially equal to an area of one of the gate stack 280L, from a top-view perspective. In some embodiments, the source/drain regions 270, the channel 273 (FIG. 27) and the shallow doped regions 234 may be collectively referred to as an active region 230 of the gate structure 240. In some embodiments, the gate stacks 280L land on a boundary between the gate structure 240 and the source/drain regions 270. In some embodiments, at least a portion of the gate stacks 280L overlaps the gap between the gate structure 240 and the source/drain regions 270. Additionally, the length L of the gate stacks 280L may be substantially equal to the length of the gate dielectric 242 in second direction D2. The gate stack 280L may have an extension length $L_e$ measured from an edge of the source/drain regions 270 to an edge of the gate stack 280L. In some embodiments, the extension length $L_e$ is greater than or equal to 0.05 μm. A spacing S3 is between the gate stack 280L and a neighboring gate stack 280P. In some embodiments, the spacing S3 is greater than the spacing S1. The spacing S3 may be greater than or equal to 0.3 μm in accordance with some embodiments. In some embodiments, the insulating layer 250 further has an extension width E3 measured from an edge of the insulating layer 250 to an edge of the source/drain regions 270. In some embodiments, the extension width E3 is greater than or equal to 0.05 μm. The length $L_e$, the spacing S3 and the extension width E3 may be configured based on different requirements for different semiconductor devices.

Based on the operations with reference to FIGS. 27 and 28, a first-voltage device 210a and a second-voltage device 210b are thus formed. The first-voltage device 210a includes the gate electrode 244, the gate dielectric 242, and the source/drain regions 270. The second-voltage device 210b includes the gate electrode 384, the gate dielectric 382, and the source/drain regions 370. The gate stacks 280P and the gate stacks 280L formed over the first-voltage device 210a may serve as protection structures. For example, the gate stacks 280P may serve as first protection structures for protecting the underlying gate structure 240 during the planarization of the ILD layer 276. The gate stack 280L may serve as a second protection structure for protecting the underlying gate dielectric 242 and the insulating layer 250 during the planarization of the ILD layer 276. The gate stack 280L may further serve as spacers for the gate structure 240.

In accordance with some embodiments, the first-voltage device 210a is a MV MOS device or a HV MOS device, while the second-voltage device 210b is a LV MOS device. In some embodiments, the thickness of the gate dielectric 384 (and 284) is selected to match the operating voltage of the second-voltage device 210b. The gate dielectric 242 of the first-voltage device 210a is thick enough to sustain the medium voltages or high voltages. The thickness of the gate dielectric 384 (and 284) is thinner than the thickness of the gate dielectric 242.

The proposed structures provides advantages. In cases where the insulating layer 250 is otherwise absent, the gate dielectric 282 of the gate stack 280L may directly contact the underlying gate dielectric 242, the shallow doped region 234, and the doped region 272 of the gate electrode 244. During operation of the first-voltage device 210a, a breakdown is likely to be formed through the source/drain regions 270, the gate dielectric 282 of the gate stack 280L, and the gate dielectric 242. Therefore, an undesired leakage current may occur in the first-voltage device 210a. The presence of the insulating layer 250 may prevent the breakdown between the gate electrode 244 and the source/drain regions 270. Further, the presence of the insulating layer 250 may serve as an additional spacer, in addition to the gate spacer 268, between the gate dielectric 242 and the source/drain regions 270.

Figure 29:
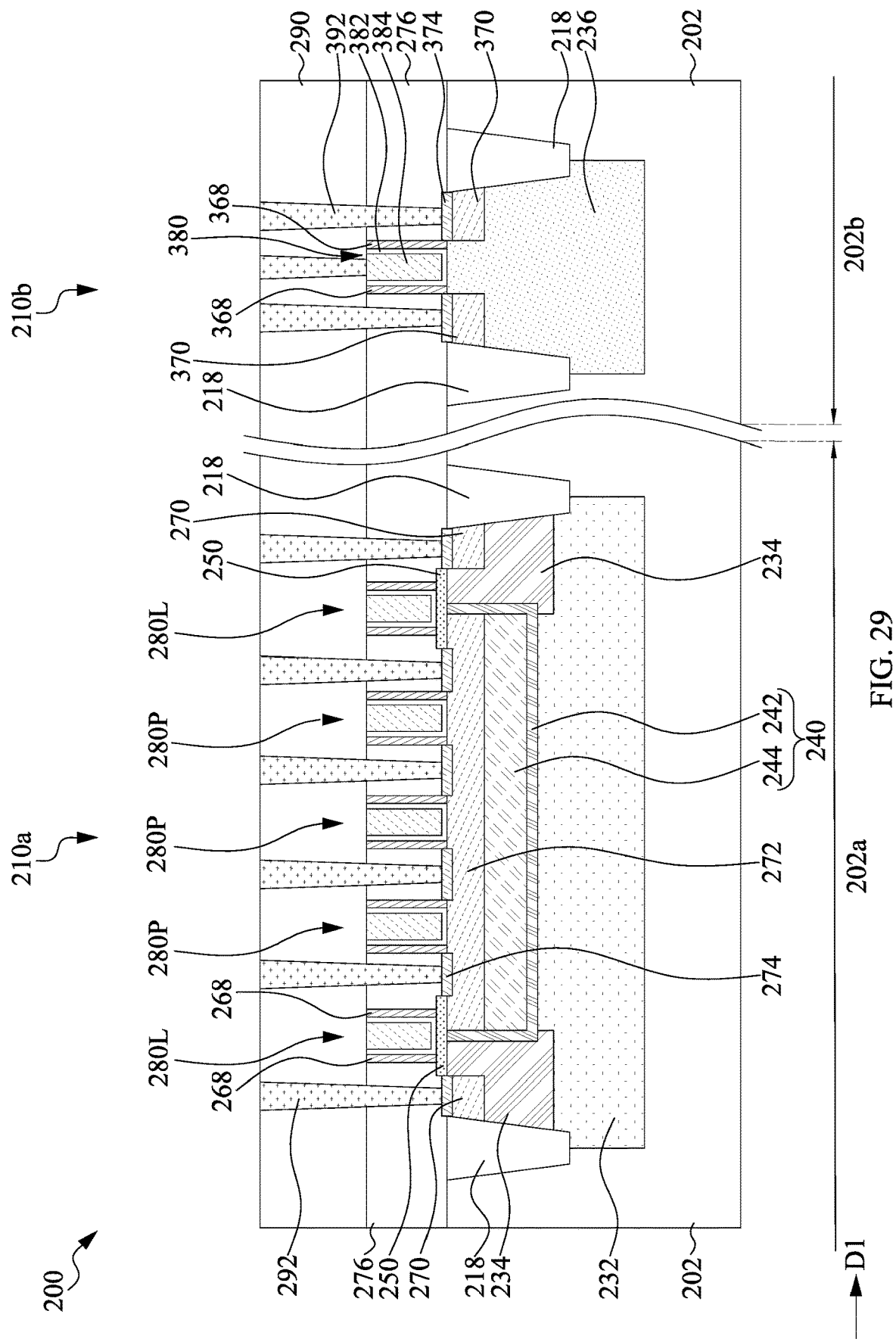

FIG. 29 illustrates the formation of a dielectric layer 290 over replacement gate stacks 280 and 380. The dielectric layer 290 may be formed of a material selected from the same candidate materials for forming the ILD layer 276. The materials of the ILD layer 276 and the dielectric layer 290 may be the same or different from each other.

Referring to FIG. 29, contact plugs 292 and 392 are formed in the dielectric layer 290 and the ILD layer 276. The formation process may include forming contact plug openings in the ILD layer 276 and the dielectric layer 290 to expose the source/drain regions 270/370, the gate electrode 244 and the gate electrode 384, and filling the contact plug openings to form the contact plugs 292 and 392. In some embodiments, the contact plugs 292 land on the gate electrode 244 may be referred to as gate vias of the first-voltage device 210a. In some embodiments, at least one of the contacts plugs 292 land on the gate electrode 244 is between two gate stacks 280P. In alternative embodiments, the contact plugs 292 in the first device region 202a may be formed over the top surface of the gate stack 280P. A bias voltage may thus be supplied through the contact plug 292 and the gate stack 280P to the gate electrode 244.

Figure 30:
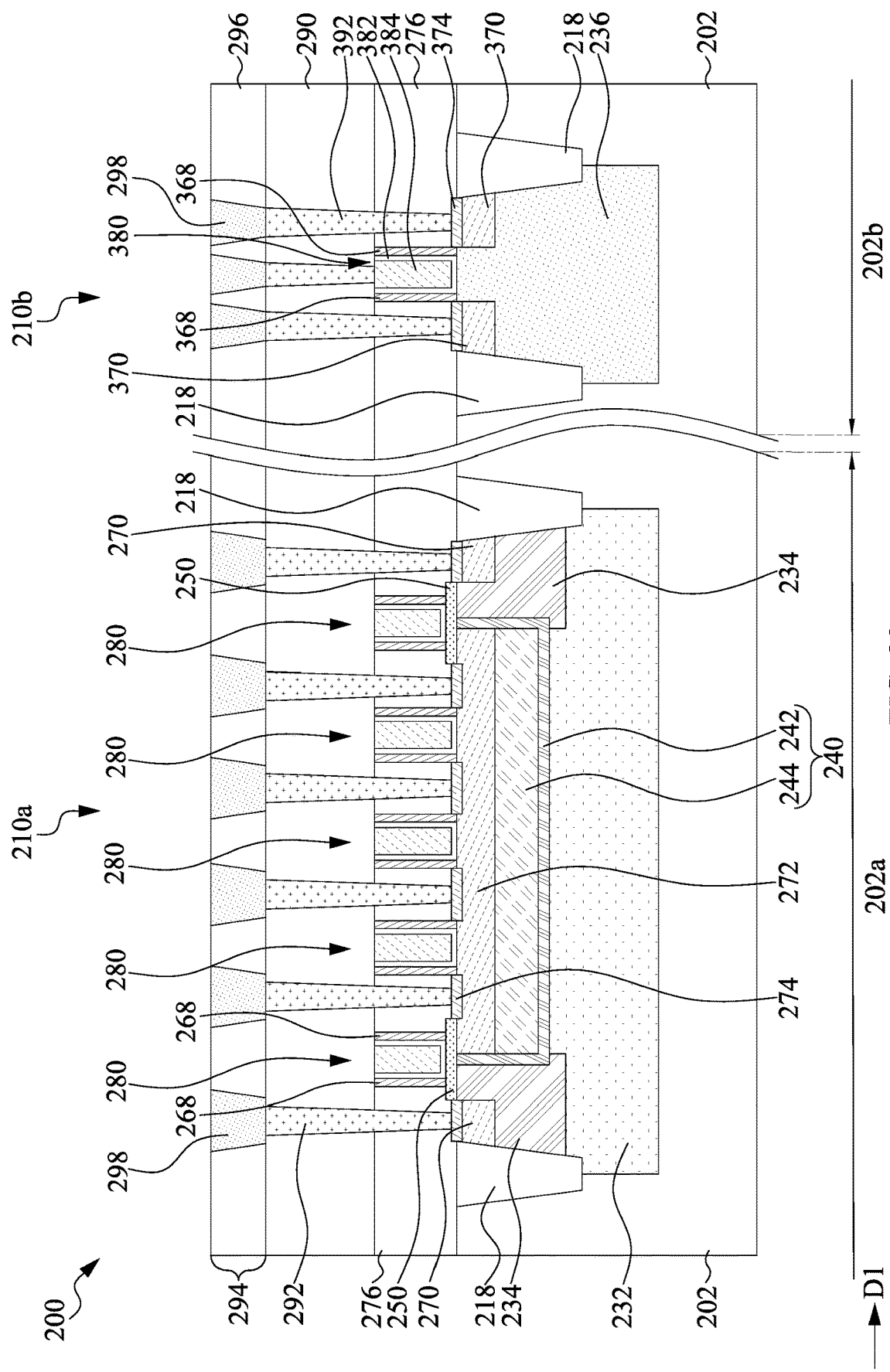

Referring to FIG. 30, an interconnect structure 294 is arranged over the dielectric layer 290. The interconnect structure 294 may comprise one or more inter-metal dielectric (IMD) layers 296. The IMD layer 296 may comprise, for example, one or more layers of an oxide, a low-k dielectric, or an ultra-low-k dielectric. The IMD layer 296 may surround metal wires 298 or metal vias (not shown) that comprise, for example, copper, tungsten, and/or aluminum. In some embodiments, the contact plugs 292 are configured to electrically couple the source/drain regions 270 of the first-voltage device 210a to a first metal wire 298 of the interconnect structure 294. In some embodiments, the contact plugs 392 are configured to electrically couple the source/drain regions 370 of the second-voltage device 210b to the first metal wire 298 of the interconnect structure 294.

The structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be repeated.

Figure 31:
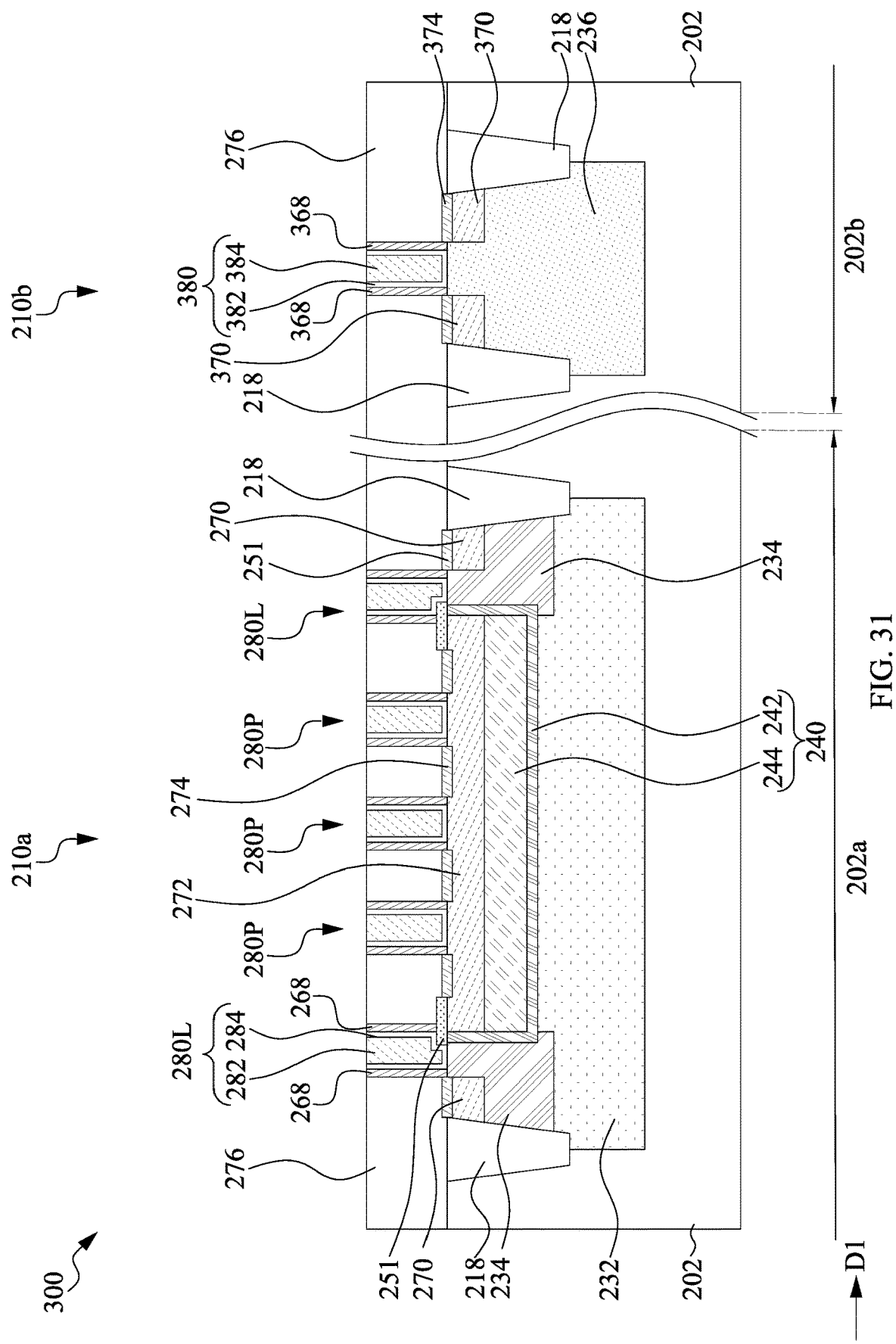
FIG. 31 is a cross-sectional view illustrating a semiconductor structure at a fabrication stage according to aspects of one or more embodiments of the present disclosure.
Figure 32:
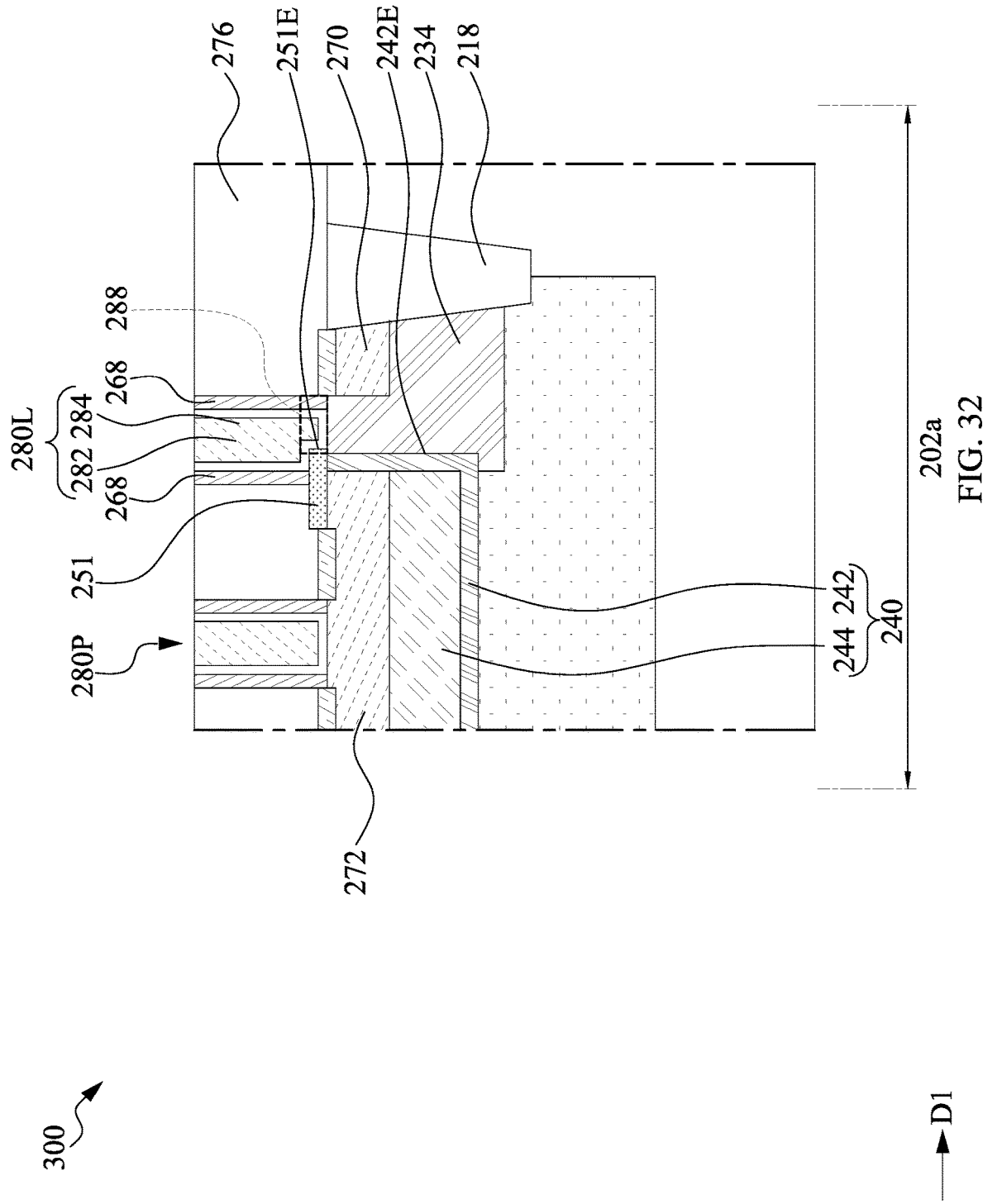
FIG. 32 is an enlarged view of FIG. 31.

FIG. 31 is a schematic drawing illustrating a semiconductor structure 300 at a fabrication stage according to aspects of one or more embodiments of the present disclosure, and FIG. 32 is an enlarged view of FIG. 31. Referring to FIG. 31, an insulating layer 251 is formed instead of the insulating layer 250 previously discussed, in which the insulating layer 251 may have a width less than that of the insulating layer 250 of the semiconductor structure 200. The insulating layer 251 covers the top surface of the underlying gate dielectric 242, while the top surfaces of the shallow doped regions 234 are exposed through the insulating layer 251. In some embodiments, an edge 251E of the insulating layer 251 is close to the edge 242E of the underlying gate dielectric 242, but this edge 251E is not aligned to the edge 242E of the underlying gate dielectric 242. In some embodiments, at least a portion of the insulating layer 251 protrudes in the first direction D1. In alternative embodiments, the edge of the insulating layer 251 is aligned to the edge of the underlying gate dielectric 242.

Referring to FIG. 32, the replacement gate stacks 280L formed thereafter may have a protrusion 288 contacting the top surface of the shallow doped region 234. The protrusion 288 includes a portion of the gate dielectric 282 and a portion of the gate electrode 284. The gate dielectric 282 of the gate stack 280L may contact the shallow doped region 234. Further, at least a portion of the gate dielectric 282 and at least a portion of the gate electrode 284 (the protrusion 288) is between the insulating layer 251 and the gate spacer 268.

The source/drain regions 270 and the silicide regions 274 formed thereafter may have edges aligned to the edges of the gate spacers 268. The source/drain regions 270 may be spaced apart from the gate dielectric 242 by the insulating layer 251, the gate dielectric 282 of the gate stack 280L, the gate electrode 284 of the gate stack 280L, and the gate spacer 268. The gate stack 280L may serve as a protection structure for protecting the underlying gate dielectric 242 and the insulating layer 251 during the planarization of the ILD layer 276. The gate stack 280L may further serve as spacers for the gate structure 240.

The embodiments of the present disclosure have some advantageous features. It is desirable to allow the HV/MV MOS devices and the LV MOS devices to share the processes for forming replacement gates in order to reduce manufacturing cost. However, the planarization for exposing the dummy gate electrodes of the LV MOS devices may result in loss of the recessed gate electrodes of the HV/MV MOS devices. This means that the HV/MV MOS devices are unable to share the manufacturing processes in forming replacement gates of the LV MOS devices. By forming an insulating layer to cover the HV/MV MOS devices and forming the dummy gate electrodes of the LV MOS devices over the insulating layer and the recessed gate electrodes of the HV/MV MOS devices, the planarization may be performed without causing the loss the gate electrodes of HV/MV MOS devices. In addition, in accordance with the embodiments of the present disclosure, the method for the forming of the source/drain regions in the LV MOS devices may be used as the forming of the doped region in the gate electrode of HV/MV MOS devices during a same process, and hence the production cost is reduced.

In accordance with some embodiments of the present disclosure, a semiconductor structure includes a substrate, a gate electrode, a gate dielectric layer, a plurality of first protection structures, a second protection structure and an insulating layer. The gate electrode is disposed within the substrate. The gate dielectric layer is disposed within the substrate and laterally surrounds the gate electrode. The first protection structures are disposed over the gate electrode. The second protection structure is disposed over the gate dielectric layer. The insulating layer is between the second protection structure and the gate dielectric layer.

In accordance with some embodiments of the present disclosure, a semiconductor structure includes a substrate, a first gate structure, a plurality of second gate structures and an insulating layer. The substrate includes a first region and a second region. The first gate structure is located in the first region and is disposed within the substrate. The second gate structures are disposed over the substrate. A first subset of the second gate structures and a second subset of the second gate structures are located in the first region, a third subset of the second gate structures is located in the second region, and the first subset and the third subset are separated by the second subset. The insulating layer is disposed over the substrate, between the first gate structure and the second subset.

In accordance with some embodiments of the present disclosure, a method includes the following operations. A substrate is received. A first gate structure is formed within the substrate. An insulating layer is formed over the substrate. A plurality of first protection structures is formed over the first gate structure and a second protection structure is formed over the insulating layer adjacent to the plurality of first protection structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a gate electrode disposed within the substrate;
   a gate dielectric layer disposed within the substrate and laterally surrounding the gate electrode;
   a plurality of first protection structures disposed over the gate electrode;
   a second protection structure disposed over the gate dielectric layer; and
   an insulating layer between the second protection structure and the gate dielectric layer.

2. The semiconductor structure of claim 1, wherein each of the plurality of first protection structures includes a first dielectric layer disposed over the substrate.

3. The semiconductor structure of claim 2, wherein each of the plurality of first protection structures includes a first conductive layer disposed over the first dielectric layer.

4. The semiconductor structure of claim 2, wherein the first dielectric layer contacts the gate electrode.

5. The semiconductor structure of claim 1, wherein the second protection structure includes a second conductive layer disposed over the insulating layer.

6. The semiconductor structure of claim 5, wherein the second protection structure includes a second dielectric layer between the second conductive layer and the insulating layer.

7. The semiconductor structure of claim 5, wherein a portion of the second conductive layer overlaps the gate electrode.

8. The semiconductor structure of claim 1, further comprising a silicide region disposed between the second protection structure and an adjacent first protection structure of the plurality of first protection structures.

9. The semiconductor structure of claim 8, wherein the second protection structure is separated from the silicide region by the insulating layer.

10. A semiconductor structure, comprising:
    a substrate comprising a first region and a second region;
    a first gate structure located in the first region and disposed within the substrate;
    a plurality of second gate structures over the substrate, wherein a first subset of the plurality of second gate structures and a second subset of the plurality of second gate structures are located in the first region, a third subset of the plurality of second gate structures is located in the second region, and the first subset and the third subset are separated by the second subset; and
    an insulating layer over the substrate, between the first gate structure and the second subset,
    wherein the first gate structure laterally surrounds and is overlapped with an entirety of each of the first subset of the plurality of second gate structures from a top-view perspective.

11. The semiconductor structure of claim 10, wherein the first subset overlaps the first gate structure.

12. The semiconductor structure of claim 10, wherein the first subset contacts the first gate structure.

13. The semiconductor structure of claim 10, wherein the second subset overlaps a portion of the first gate structure.

14. The semiconductor structure of claim 10, wherein a height of the second subset is different from a height of the first subset.

15. The semiconductor structure of claim 14, wherein the height of the first subset is substantially equal to a height of the third subset.

16. The semiconductor structure of claim 10, further comprising a gate via electrically connected to the first gate structure.

17. A method for forming a semiconductor structure, comprising:
    receiving a substrate;
    forming a first gate structure within the substrate;
    forming an insulating layer over the substrate; and
    forming a plurality of first protection structures over the first gate structure and a second protection structure over the insulating layer adjacent to the plurality of first protection structure,
    wherein the second protection structure is overlapped with an entirety of one side of the first gate structure from a top-view perspective.

18. The method of claim 17, further comprising forming a doped region in the first gate structure.

19. The method of claim 17, further comprising forming a silicide region over the first gate structure.

20. The method of claim 19, wherein the silicide region is separated from the second protection structure by the insulating layer.

* * * * *